(12) United States Patent
Fukuda

(10) Patent No.: US 6,811,954 B1
(45) Date of Patent: Nov. 2, 2004

(54) SEMICONDUCTOR INTEGRATED CIRCUIT DEVICE AND METHOD OF MANUFACTURING THE SAME, AND METHOD OF MANUFACTURING MASKS

(75) Inventor: Hiroshi Fukuda, Kodaira (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/149,714
(22) PCT Filed: Feb. 25, 2000
(86) PCT No.: PCT/JP00/01096
§ 371 (c)(1), (2), (4) Date: Jun. 14, 2002
(87) PCT Pub. No.: WO00/63653
PCT Pub. Date: Aug. 30, 2001

(51) Int. Cl.$^7$ .............................. G03F 7/00; G03F 9/00
(52) U.S. Cl. ..................... 430/311; 430/5; 430/313; 430/322; 430/394; 430/396
(58) Field of Search ............................ 430/5, 311, 313, 430/322, 394, 396

(56) References Cited

U.S. PATENT DOCUMENTS 5,523,186 A * 6/1996 Lin et al. ........................ 430/5
5,795,685 A * 8/1998 Liebmann et al. ............. 430/5

FOREIGN PATENT DOCUMENTS

| JP | 3-173219 | 7/1991 |
| JP | 5-204131 | 8/1993 |
| JP | 6-67403 | 3/1994 |
| JP | 7-50243 | 2/1995 |
| JP | 7-106227 | 4/1995 |
| JP | 8-95230 | 4/1996 |
| JP | 8-227140 | 9/1996 |
| JP | 2638561 | 4/1997 |
| JP | 2650962 | 5/1997 |
| JP | 11-15129 | 1/1999 |

OTHER PUBLICATIONS

Pati, Y. C. et al., "Phase–Shifting Masks: Automated Design and Mask Requirements", *SPIE*, vol. 2197, 1994, pp. 314–327.

Fukuda, Hiroshi, "Node connection/quantum phase–shifting mask—Path to below 0.3–um pitch, proximity effect free random interconnect and memory patterning", *1999 Symposium on VLSI Technology Digest of Technical Papers*, 1999, pp. 123–124.

* cited by examiner

Primary Examiner—Mark F. Huff
Assistant Examiner—Nicole Barreca
(74) Attorney, Agent, or Firm—Miles & Stockbridge P.C.

(57) ABSTRACT

In forming linear circuit patterns running in vertical and horizontal directions, phases are arranged such that phases between proximate opening patterns are reversed. Type A phase conflict patterns have the same phase and are proximate to each other. Type B phase conflict patterns have reverse phases and are brought into contact with each other. Patterns for resolving the phase conflicts are generated, and a phase mask having a conflict resolving pattern and a complementary phase mask for forming a design pattern complementary therewith are subjected to multiple exposures on a substrate. Circuit patterns having a very small pitch which have been regarded to be difficult to manufacture can be manufactured by the multiple exposure of at most two sheets of the phase-shifting masks and a semiconductor integrated circuit device can be manufactured at low cost by designing the circuit patterns in a short period of time.

8 Claims, 26 Drawing Sheets

☐ : 0 DEGREE     Ⓐ : TYPE A PHASE CONFLICT
▨ : 180 DEGREE     Ⓑ : TYPE B PHASE CONFLICT

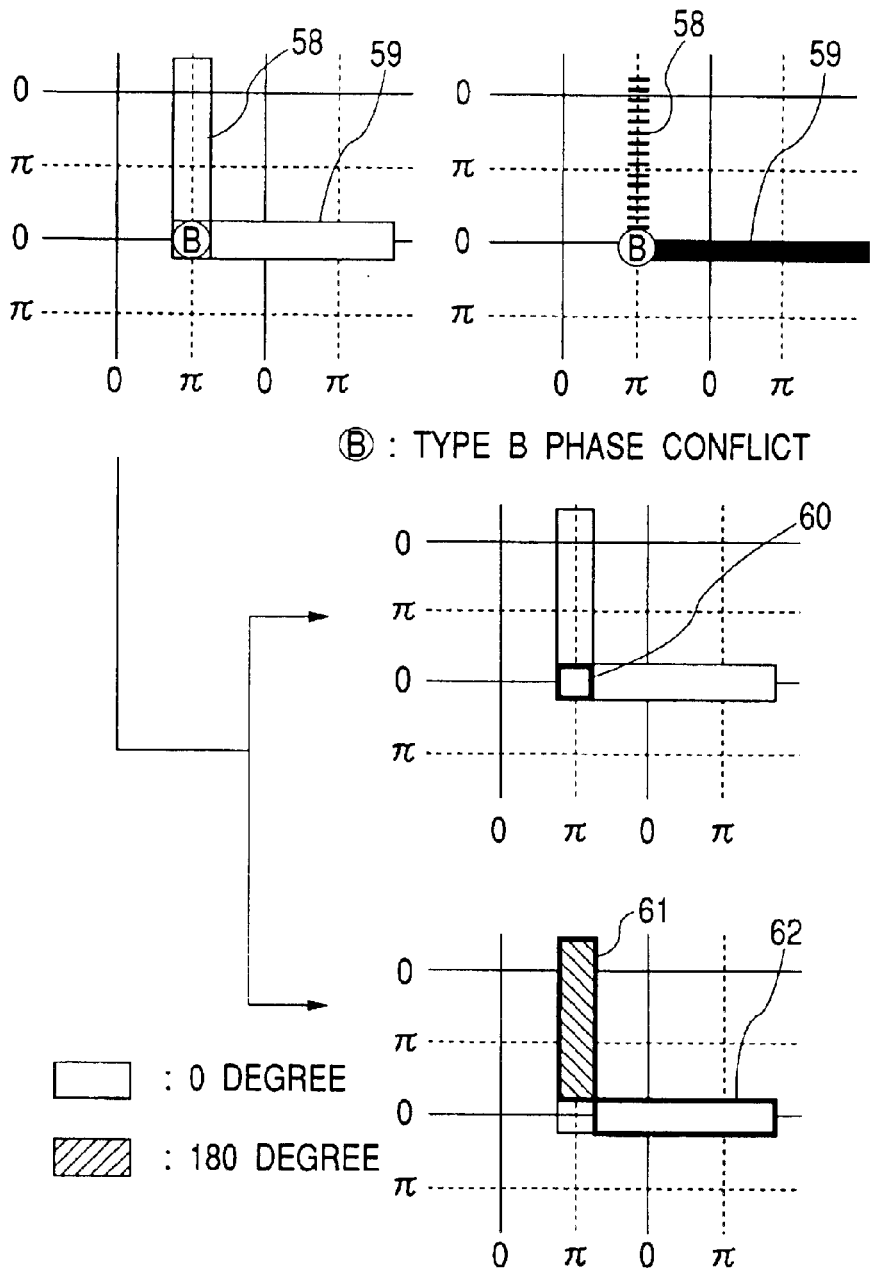

Ⓑ : TYPE B PHASE CONFLICT

⬭C⬭ : TYPE C PHASE CONFLICT

Ⓐ : TYPE A PHASE CONFLICT
Ⓑ : TYPE B PHASE CONFLICT
Ⓒ : TYPE C PHASE CONFLICT

☐ : 0 DEGREE   ▨ : 180 DEGREE

☐ : 0 DEGREE   ▨ : 180 DEGREE

DESIGNED PATTERN → CORRECTED PATTERN

FIG. 24A  FIRST EXPOSURE
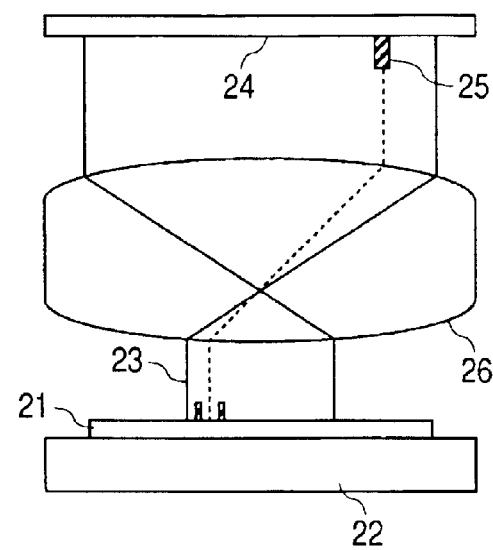
FIG. 24B  SECOND EXPOSURE
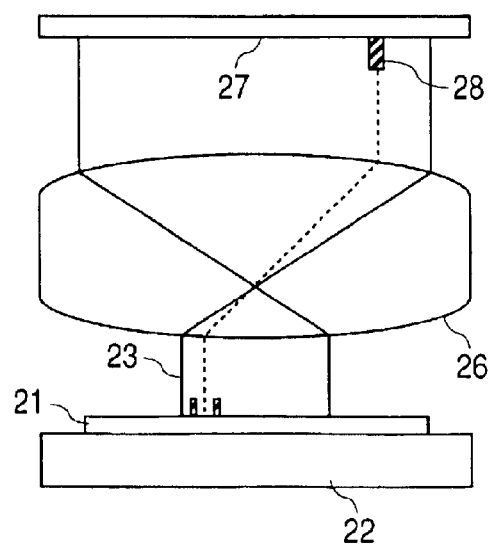

NAND cell 0.5 μm

PRIOR ART

— ISOLATION REGION
— GATE
— CONTACT HOLE
— FIRST METAL LAYER 0.3 μm

PRESENT INVENTION

SEMICONDUCTOR INTEGRATED CIRCUIT DEVICE AND METHOD OF MANUFACTURING THE SAME, AND METHOD OF MANUFACTURING MASKS

TECHNICAL FIELD

The present invention relates to a semiconductor integrated circuit device of a semiconductor device particularly including a logic integrated circuit or logic LSI or the like, a method of manufacturing the same and a method of manufacturing a mask formed with a pattern used therefor.

BACKGROUND ART

High performance/sophisticated features of a semiconductor integrated circuit are achieved by miniaturized formation/highly integrated formation of a circuit pattern. For example, in the case of logic LSI, speeding-up has been promoted by reducing a gate length of a transistor and sophisticated features has been achieved by increasing a circuit density per unit area. In accordance therewith, a pitch of arranging wirings (interconnected) for connecting logic gates to each other has rapidly been miniaturized. With regard to progress in the wiring pitch, although currently, a pitch of 0.8 through 0.4 μm is considered to be achieved by using a KrF excimer laser exposure apparatus, further, a pitch of about 0.3 μm is considered to be achieved by using an ArF excimer laser exposure apparatus, it is anticipated that a pitch smaller than 0.3 μm is difficult to realize by a conventional reduction projection exposure method using deep ultra violet light. Hence, as a method of realizing a further smaller pattern, an electron beam writing method (or EB lithography), an X-ray exposure method (or proximity X-ray lithography) or the like has been investigated. Meanwhile, as a method of promoting resolution performance of an optical system without changing the optical system, there is known a phase-shifting mask. According to the method, phase of light transmitting through a specific light transmitting portion (also referred to as opening portion) on a mask is controlled (normally, reversed by 180 degrees), by which resolution of an optical system is significantly promoted in comparison with a case of using a conventional mask.

According to the phase shifting method, there is needed phase arrangement for determining at which portion of a circuit pattern the phase is reversed at a design stage. However, according to an actual circuit pattern, some patterns in which phase arrangement is essentially difficult may be produced. For example, a case in which U-shape patterns or three light transmitting patterns (that is, opening patterns) are arranged at distances the most proximate to each other, corresponds thereto and this is referred to as phase conflict. Since the problem is difficult to resolve, the phase-shifting mask has been applied and used to restrict to a simple pattern of a memory cell of the memory LSI or the like.

A method of avoiding the phase conflict even in the case of applying the phase-shifting mask to a complicated pattern has been reported by Oi et al. According thereto, a layout avoiding the phase conflict is calculated by carrying out compaction after phase arrangement at a symbolic level.

Other method of resolving the phase conflict is based on a concept of carrying out multiple exposure of a plurality of masks including the phase-shifting mask on the same photoresist layer. The concept has been patented by the inventors in Japanese Patent No. 2650962 and No. 2638561. Further, application of the concept to various circuit patterns has been reported. For example, an application for forming a gate pattern of a logic LSI has been filed for patent by Jinbo or Komatsu et al. (Japanese Patent Laid-Open No. Hei 5(1993)-204131, Japanese Patent Laid-Open No. Hei 6(1994)-67403). Further, a method of applying the concept to a wiring has been filed by B. J. Lin et al. (Japanese Patent Laid-Open No. Hei 8 (1996)-227140). Further, an arbitrary pattern generation algorithm by a phase-shifting mask using a phase retrieval method has been proposed by Y. C. Pati et al. (SPIE: Optical/Laser Microlithography VII, SPIE Vol. 2197 (1994) pp.314–327).

However, the above-described electron beam writing method or X-ray exposure method poses the following problems. First, according to the electron beam writing method, enormous time is taken for successively writing individual patterns. Hence, there is investigated a cell projection method capable of transcribing all pattern of a certain degree of a scale (for example, about 5 μm square), however, a kind of a pattern which can be set is limited and therefore, the method is not effective in a random wiring pattern of a logic LSI. Further, although there has been investigated an SCALPEL method capable of carrying out scanning exposure of a large area mask, the throughput is greatly reduced compared with that of the current exposure method.

Further, according to the X-ray exposure method, there poses a problem that it is difficult to realize a mask having sufficient accuracy.

Meanwhile, there poses the following problems in various methods which have been proposed conventionally for applying the phase-shifting mask method to an actual complicated circuit pattern.

For example, according to the method of carrying out compaction after phase arrangement at a symbolic level, a circuit dimension of the portion of producing the phase conflict is alleviated and therefore, the method is essentially counter to miniaturization of circuit.

Meanwhile, a logic LSI in recent times exceeds a manually designable scale and almost all of logic LSI's are designed by using an automatic place and route method. Therefore, it is necessary to generate a phase-shifting mask with respect to automatically generated enormous pattern data and it is nonrealistic to generate the phase-shifting mask manually by trial and error.

However, in the method of dealing with a complicated pattern by using multiple exposure of a plurality of masks, for example, according to Japanese Patent Laid-Open No. Hei 5(1993)-204131 or Japanese Paten Laid-Open No. Hei 8 (1996)-227140, a rule for decomposing an original design pattern into a plurality of masks is not generalized and therefore, there poses a problem that it is difficult to deal with actual enormous LSI data.

Further, methods disclosed in Japanese Patent Laid-Open No. Hei 5(1993)-204131 or Japanese Patent Laid-Open No. Hei 6(1994)-67403, are for miniaturizing a gate of a transistor and there poses a problem that it is difficult to reduce a wiring pitch by applying the methods to a wiring pattern.

Meanwhile, according to the method of decomposing a pattern in vertical and horizontal directions disclosed in Japanese Paten Laid-Open No. Hei 8(1996)-227140, it is difficult to correspond to an arbitrary pattern in a random wiring of a logic LSI. For example, when a circuit pattern 5 shown in FIG. 29 is decomposed in vertical and horizontal directions, two sheets of masks V and H are formed as shown by FIGS. 30(*a*) and 30(*b*), however, in this case, for example, phase conflict between two light transmitting portions (opening portions) X1 and X2 in the mask H is not resolved. In FIG. 30, numeral 1 designates a light blocking portion and numerals 2, 3 and 4 designate light transmitting portions (opening portions). According to the above-described publicly-known example, there is suggested a way of thinking that the light transmitting (opening) patterns X1 and X2 on the mask are further distributed to two sheets of masks, however, in this case, X1 and X2 constitute incoherent summation and therefore, it is difficult to clearly separate these. Further, since there is not given a general guiding principle therefor, it is difficult to apply the way to a large scale LSI pattern including an enormous random patterns for which manual operation is substantially impossible as described above.

Further, since a phase arranging method using the phase retrieval method requires an enormous amount of calculation and therefore, it is difficult to carry out the processing on the large scale data in a practical time period, further, the generated mask pattern is complicated, there poses a problem that a limit or the like in actually manufacturing a mask is not necessarily taken into consideration.

Meanwhile, the inventors have presented a method of capable of applying phase shift to an arbitrary pattern by a further general algorism in Digest of Technical Papers, 1999 Symposium on VLSI Technology (1999) pp.123–124, "Node connection/quantum mask—Path to below 0.3-$\mu$m pitch, proximity effect free random interconnect and memory patterning".

According to the method described in the 1999 Symposium on VLSI Technology, three sheets or more of masks are required for forming a wiring pattern and there poses a problem that the mask cost is increased.

As described above, there has not been a general and low cost method for making an alternating type phase shifting method applicable to a random wiring pattern. Therefore, there pose problems, (1) miniaturized formation of a circuit pattern of a logic LSI and a reduction in a chip area are determined by a limit of a wiring pitch of optical lithography using a conventional mask, and (2) the electron beam writing method having an extremely low throughput is obliged to use when a reduction in the wiring pitch exceeding a limit of optical lithography using the conventional mask is intended to achieve.

It is an object of the invention to provide an improved method of manufacturing a semiconductor integrated circuit device capable of forming a very small circuit pattern by a combination of a projection exposure method and a phase-shifting mask.

Thereby, a logic LSI such as a microcomputer which is random (irregular) and having an enormous amount of very small circuit patterns at low cost and in a short period of time. That is, by manufacturing a logic LSI having a random wiring pattern constituted by a very small wiring pattern having a wiring interval equal to or smaller than 0.15 $\mu$m by using optical lithography, which has been regarded to be difficult realistically by the conventional optical lithography, high performance formation and high function formation of a semiconductor integrated circuit device can be achieved at low cost.

It is other object of the invention to provide a method of designing and manufacturing a mask pattern in which an alternating phase shifting is applicable to an arbitrary pattern by multiple exposure of at most two sheets of phase-shifting masks even in the case of a very small circuit pattern having random (irregular) and an enormous amount of wiring patterns or the like of a logic LSI, at low cost and in a short period of time.

DISCLOSURE OF INVENTION

A simple explanation will be given as follows of an outline of a representative aspect of the invention disclosed in the application.

The invention is carried out by analyzing characteristics of phase conflicts caused by shapes, arrangements and the like of various patterns in forming phase-shifting masks for a very small circuit pattern.

That is, the invention is carried out by analyzing various circuit patterns of logic LSI which has been regarded to be difficult to use conventional phase-shifting masks, analyzing characteristics of phase conflicts of particularly proximate patterns having straight lines, ends, L-shape portions and T-shape portions (that is, straight line portions running in parallel in vertical and horizontal directions, line-ends, corners and intersections or crossings) and rather utilizing the characteristics.

For example, according to a method of manufacturing a semiconductor integrated circuit device of the invention, in forming an opening pattern having a plurality of straight lines, ends and L-shape portions or T-shape portions in a photoresist film provided at an upper portion of a semiconductor region, the opening pattern is formed by subjecting the photoresist film to multiple projection exposure by using two sheets of masks comprising a first mask having a first light transmitting portion corresponding to the ends and the L-shape portions or T-shape portions of the pattern and a second mask having a second light transmitting portion corresponding to the straight lines.

Further, when the plural straight lines, ends and L-shape portions or T-shape portions of the opening pattern are arranged neighbouringly to other straight lines or ends at intervals equal to or smaller than 0.15 $\mu$m, the first mask and the second mask are constituted by phase-shifting masks.

Further, according to other method of manufacturing a semiconductor integrated circuit device of the invention, in forming a circuit pattern running in vertical and horizontal directions in a photosensitive material provided at an upper portion of a semiconductor region, the circuit pattern is formed by subjecting the photosensitive material to multiple exposure by using a projection optical system by using a first phase shifting mask having a light transmitting portion corresponding to both of patterns running in parallel proximately to each other in a vertical direction of the circuit pattern and patterns running in parallel proximately to each other in a horizontal direction and a second phase-shifting mask having a light transmitting portion corresponding to any of line-ends, corners or intersections of the circuit pattern.

According to still other method of manufacturing a semiconductor integrated circuit device of the invention, in forming a pattern on a photosensitive substrate by subjecting the substrate to projection exposure by using a mask having a circuit pattern, the photosensitive substrate is subjected to multiple projection exposure by using a first phase-shifting mask including a first phase conflict resolving mask pattern for forming a mask light transmitting portion corresponding to a pattern region for constituting a first possible phase conflict region at a vicinity of a distal end portion of a line pattern having an adjacent pattern within a predetermined distance therefrom and a second phase conflict resolving mask pattern for forming a mask light transmitting portion corresponding to a pattern region for constituting a second possible phase conflict region at a vicinity of an intersection of a line pattern extended in a vertical direction and a line pattern extended in a horizontal direction, and a second phases shifting mask including a complimentary pattern for forming the predetermined circuit pattern by subjecting the photosensitive substrate to multiple exposure along with the first and the second phase conflict resolving mask patterns to thereby form a very small circuit pattern on the photosensitive substrate.

Further specifically, by subjecting a photoresist film to multiple projection exposure by the above-described masks by using KrF excimer laser, logic LSI constituted by a very small pattern having an irregular pitch equal to or smaller than 0.3 $\mu$m (that is, pattern width is equal to or smaller than 0.15 $\mu$m and pattern interval is equal to or smaller than 0.15 $\mu$m) which has been regarded to be difficult to manufacture, can be manufactured with excellent reproducibility by using the conventional projection exposure technology. Further, similarly, when ArF excimer laser or F2 laser is used as a light source, a very small pattern respectively having a pitch of 0.23 $\mu$m or a pitch equal to or smaller than 0.19 $\mu$m can be dealt with.

Further, according to the invention, the circuit pattern is a pattern of a region corresponding to a light transmitting portion (referred to also as opening portion) on a mask, that is, an opening portion provided at, for example, a positive-tone photoresist film and actually signifies a pattern of any of a conductor region, a semiconductor region, or a non-conductive region other than the above-described region in planar arrangement of wirings or the like in a semiconductor device. Which of a conductor region, a semiconductor region or a nonconductive region is specified by a light transmitting region (that is, opening region, region for irradiating light to a photoresist film) of a mask, differs by whether a positive-tone resist is used or a negative tone resist is used in a pattern transcribing process, or whether a wiring pattern is formed by etching a wiring material in a wiring process, or a wiring material is embedded in a trench pattern in an insulator film by using what is called damascene process.

Furthermore, the two sheets of masks suitable for the invention are manufactured by the following procedure. That is, (1) when the light transmitting patterns arranged in parallel are proximate to each other such that a distance therebetween is within a predetermined value, phases of the light transmitting patterns are set such that phases of light projected between the two light transmitting patterns are reverse to each other, (2) in a plurality of the light transmitting patterns designated with phases thereby, when the light transmitting patterns having a same phase to be separated from each other are proximate to each other within the predetermined distance, proximate portions thereof and patterns at vicinities thereof are extracted and stored as first phase conflict region information in the meantime, when patterns to be consecutive are constituted by a plurality of the light transmitting patterns having different phases, overlap portions or contact portions of the plurality of light transmitting patterns having the different phases and patterns at vicinities thereof are extracted and stored as second phase conflict region information, (3) phase conflict resolving patterns for resolving phase conflicts are generated corresponding to corresponding respective regions by using the first and the second conflict region information, (4) complimentary patterns for forming the desired circuit pattern by subjecting a single photosensitive substrate to multiple exposure along with the phase conflict resolving patterns, are generated, (5) a first phase-shifting mask including the phase conflict resolving patterns and a second phase-shifting mask including the complimentary patterns are manufactured.

BRIEF DESCRIPTION OF DRAWINGS

FIG. 3 is a pattern plane view for explaining a problem of the invention and a second principle of the invention, FIGS. 24(a) and 24(b) are schematic views showing an exposure apparatus according to other embodiment of the invention.

BEST MODE FOR CARRYING OUT THE INVENTION

Figure 1A:
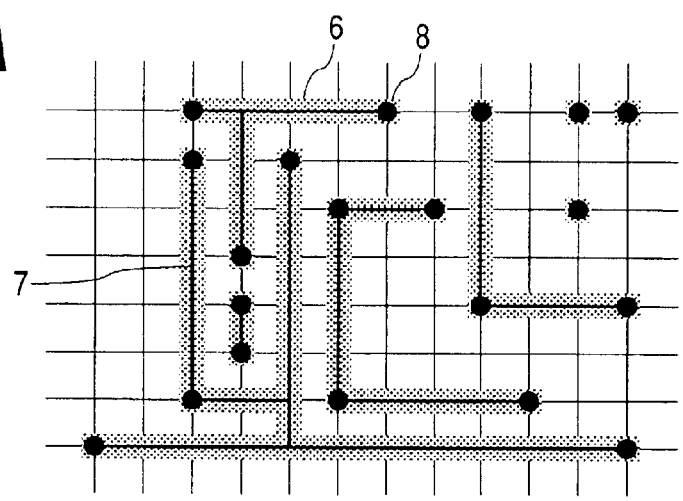
FIGS. 1(a) and 1(b) are plain views schematically showing a wiring pattern constituting an object to which the invention is applied.

In the following explanation, for simplicity, as shown by FIG. 1(a), circuit patterns 6, 7 and the like are constituted by line segments having a predetermined width connecting lattice points of a predetermined lattice (hereinafter, referred to as basic lattice). The assumption is substantially proper in a case of a large scale interconnected (wiring) systems designed on the premise of using tools for automatic place and route. In this case, a minimum wiring pitch of FIG. 1 is made to be equal to or larger than a resolution limit of a phase shift exposure method and equal to or smaller than a resolution limit (for example, equal to or smaller than 0.3 μm) of the conventional exposure method. Further, a black circle portion 8 in FIG. 1(a) indicates a portion of the pattern connected to an object of a wiring or the like (for example, electrode or via) therebelow at the portion.

Figure 1B:
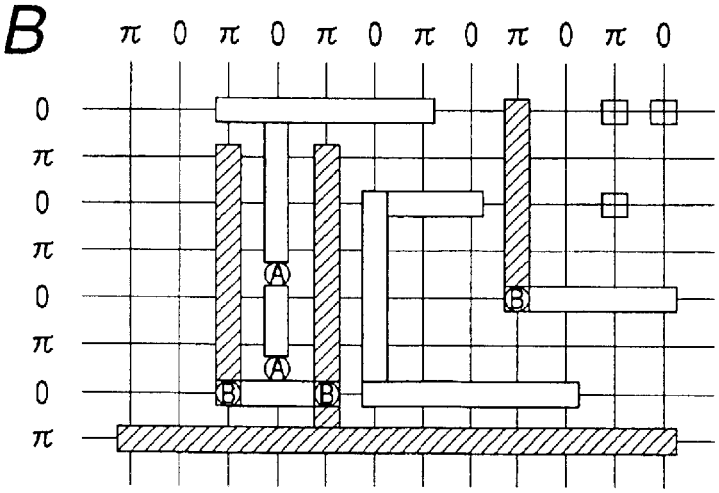

In order to resolve to clearly separate adjacent wirings by projection exposure, it is necessary to reverse phases of two patterns running in parallel at a minimum interval of 0.15 μm. Hence, first, assume that patterns are arranged with phases such that the phases of the patterns arranged along basically adjacent lattice lines are reverse to each other. This is carried out by decomposing the basic lattice into lattices 0 having a phase of 0 and lattices π having a phase of π respectively in vertical and horizontal directions as shown by FIG. 1(b) and arranging the phase 0 to a pattern corresponding to a line segment on the lattice 0 having the phase 0 and the phase π to a pattern corresponding to a line segment on the lattice π having the phase π. Further, in FIG. 1(b), a region of a white matrix indicates a pattern having the phase of 0 degree and a hatched region indicates a pattern the phase of which is shifted by 180 degrees (the same as follows).

However, when this is applied to a designed arbitrary pattern, naturally, phase conflict is caused at everywhere. The phase conflict is defined such that (1) a plurality of patterns having the equal phase to be present independently (to be separated from each other), are proximate to each other at a certain distance (in the case of FIG. 1, about twice as much as basic lattice period) or less, or (2) a pattern having a phase 0 and a pattern having a phase π are brought into contact with each other or overlap each other.

The former is referred to as phase conflict of type A and the latter is referred to as phase conflict of type B. When the phase conflict of type A is caused, two patterns which are to be separated inherently, are connected. Meanwhile, when the phase conflict of type B is caused, two patterns to be connected inherently are separated.

FIG. 1(b) shows examples of the two types of phase conflicts A and B. Further, typical examples of the respectives are shown at upper left of FIG. 2 and upper left of FIG. 3. Here, take note to that the phase conflicts are necessarily caused at lattice points, or ends or corners of patterns, or intersections.

Figure 2:
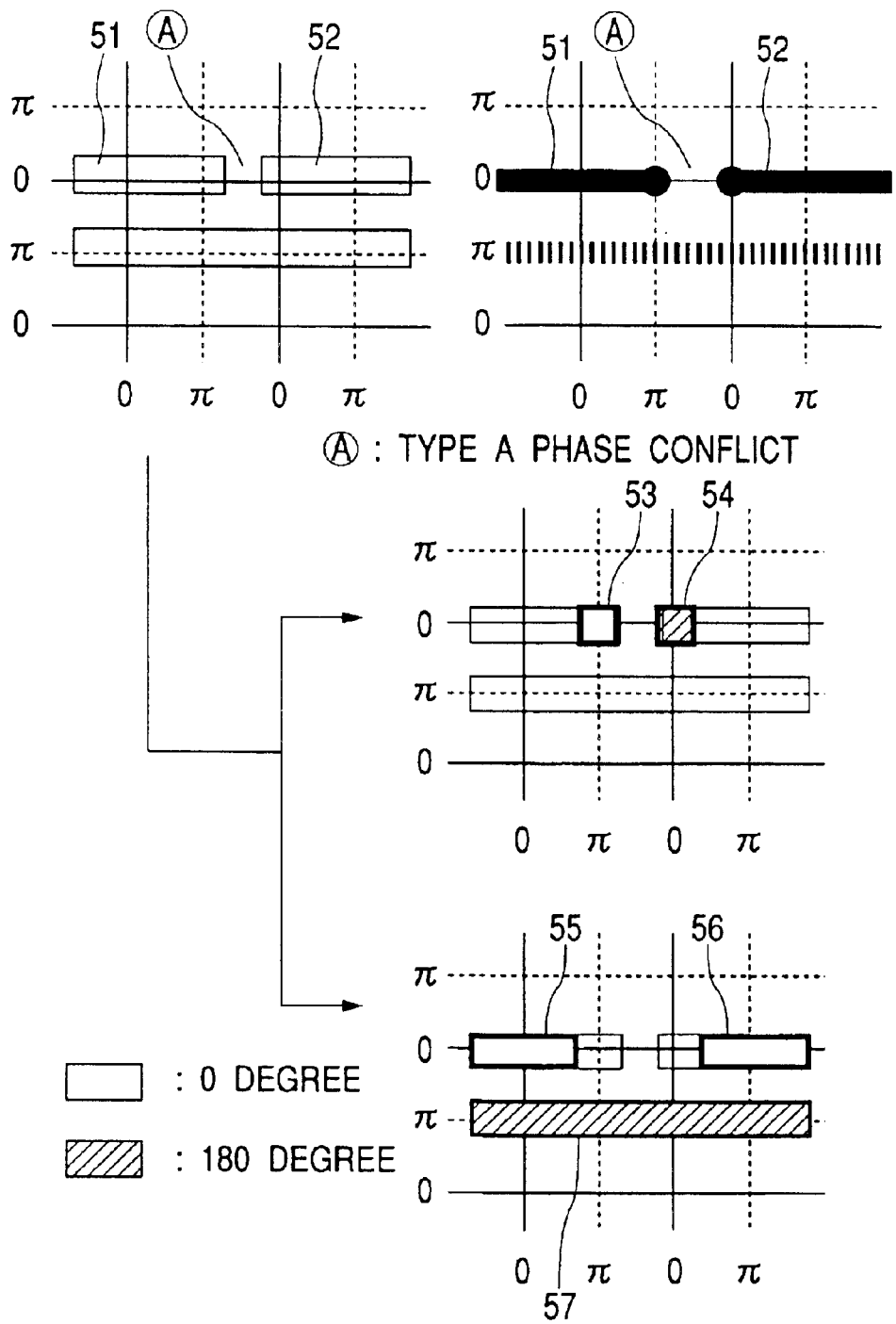
FIG. 2 is a pattern plane view for explaining a problem of the invention and a first principle of the invention.

The phase conflict of type A is caused at a portion at which a distance between line segment 51 and line segment 52 present on a lattice having a phase 0 (or a lattice having a phase π), is equal to a minimum lattice interval of the original basic lattice (upper right of FIG. 2). That is, when the lattice points belonging to two independent patterns having the same phase are adjacent to each other at the minimum lattice interval, the phase conflict of type A is caused between the two lattice points. It is known that the phenomenon is necessarily caused between a lattice point at a terminal end of a line segment and other line segment or a terminal point of other line segment. When the phase conflict of type A is caused, the two patterns 51 and 52 to be separated from each other between the two points are connected.

To resolve the phase conflict of this type, basically, the original pattern is decomposed into two sheets of mask patterns, as shown by a middle stage and a lower stage of FIG. 2 indicated by arrows and the two mask patterns are subjected to multiple exposure to the same resist film. A first mask (middle stage of FIG. 2) is a phase-shifting mask forming patterns 53 and 54 at positions corresponding to two lattice points and a second mask (lower stage of FIG. 2) is a phase-shifting mask for forming other line portions 55, 56 and 57. According to the second mask, an interval between the two independent patterns 55 and 56 having the same phase, is expanded to a distance capable of separating and resolving the two patterns even with the same phase. Thereby, the phase conflict of type A is resolved. Further, although according to the example, all of terminal points of wirings are uniformly constituted by the separate mask, this is not necessarily needed but only terminal points of wirings causing the phase conflict of type A may be extracted to the separate mask.

Meanwhile, the phase conflict of type B is caused, when polygonal lines (L-shape or T-shape lines) 58 and 59 constituting a single continuous line, are present over a lattice having a phase 0 and a lattice having a phase π, at a portion (L-shape portion) intersecting a portion belonging to the lattice having the phase 0 and a portion belonging the lattice having the phase π (upper right in FIG. 3). That is, the phase conflict of type B is caused at the portion of intersecting the line segment 59 present on the lattice having the phase 0 and the line segment 58 present on the lattice having the phase π. It is known that the phenomenon is necessarily caused at corners of polygonal lines (L-shape portions) or intersections (T-shape portions) of vertical lines and horizontal lines. When the phase conflict of the type is caused, the two patterns to be connected inherently are separated at the lattice point.

Hence, in this case, the original pattern is decomposed into two sheets of mask patterns, shown at the middle stage and the lower state of FIG. 3 indicated by arrows and the two mask patterns are subjected to multiplex exposure to the same resist film. A first mask (middle stage of FIG. 3) is formed with a pattern 60 at a position corresponding to the intersection (L-shape portion or T-shape portion) and a second mask (lower stage of FIG. 3) is formed with other line portions 61 and 62. Thereby, the phase conflict of type B is resolved. With regard thereto, although all of intersections of vertical and horizontal patterns are uniformly extracted, the conflict of type B is automatically resolved, all the intersections are not necessarily needed to extract but only terminal points of wirings causing phase conflict of type B may be extracted to the separate mask.

A phase mask pattern placed at a pair of lattice points interposing the above-described phase conflict in order to resolve the phase conflict of type A, and a mask pattern arranged at a lattice point at a position of the above-described phase conflict in order to resolve the phase conflict of type B, can be arranged on one sheet of the same mask. The two mask patterns are present on lattice points of an original basic lattice and therefore, by arranging the phases in checkers or in a shape of a checker flag, the phases can be arranged without the phase conflicts.

As described above, by decomposing the basic lattice into 0 lattices and π lattices and subjecting a first phase-shifting mask constituting phases of 0 and π by portions excluding portions of the phase conflicts of type A and type B, that is, patterns of straight line portions running in parallel in vertical and longitudinal directions on respective lattices and a second phase-shifting mask for exposing the portions of the phase conflicts of type A and type B, to multiple exposure, a random pattern on the lattices can be formed by two sheets of the masks.

As described above, a description has been given of a case in which a circuit pattern is a wiring having a constant width along predetermined lattices and a terminal end thereof is disposed on a lattice point. However, from the view point of flexibility of design, it is desirable that the restriction is more or less alleviated. For example, a bold wiring is needed for a wiring having a comparatively long distance with concern of wiring resistance. Further, in the case of a wiring at an inner portion of a standard cell of a logic LSI or the like, contact on a gate electrode and contact on an active region on a substrate, are shifted from each other by a half of a basic pitch. Therefore, there is a case in which a pattern deviated from the basic lattice is preferred. Hence, an explanation will be given as follows of a case of wirings having various widths and a case in which a pattern is present among the basic lattice. Also in these cases, it is comparatively easy to expand the invention.

Figure 4A:
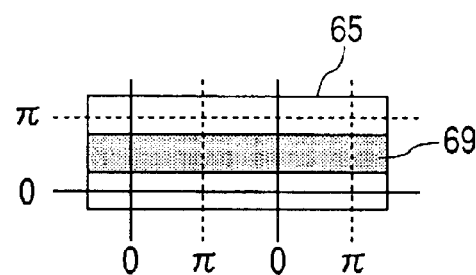
FIGS. 4(a), 4(b) and 4(c) are pattern plane views for explaining still other problem and principle of the invention.

First, assume that a wiring 65 having different width is defined by embedding an interval between wirings having a minimum line width along the basic lattice by a wiring pattern as shown by FIG. 4(a). Further, vias or contacts for connecting upper and lower substrates (not illustrated) are assumed to be present on the basic lattice as a principle. These assumptions are proper in many cases in designing a large scale wiring system on the premise of using tools for automatic place and route.

Figure 4B:
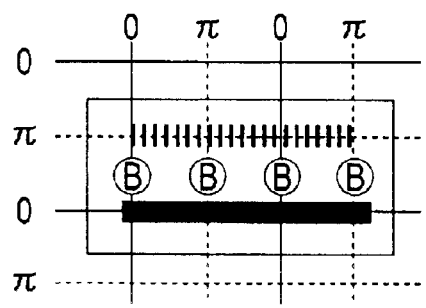
Figure 4C:
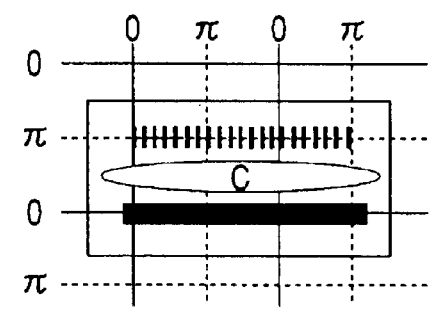

When phase conflicts of type A and type B are extracted based on the above-described definition for lattice points of the basic lattice included in a contour of the design pattern 65, as shown by FIG. 4(b), the phase conflict of type B is caused at everywhere among the lattices as indicated by numeral 69 along the wiring pattern. This is understood from the fact that when the bold wiring 65 is not present, line segments along adjacent lattice lines are to be separated and phases of the both are necessarily reversed and therefore, the phase conflict between the line segments cannot be caused. However, as described above, since the phase conflict of type B is defined between a lattice point and a lattice point, the phase conflict between a line and a line is newly defined as shown by FIG. 4(c) and is referred to as phase conflict of type C.

Figure 5:
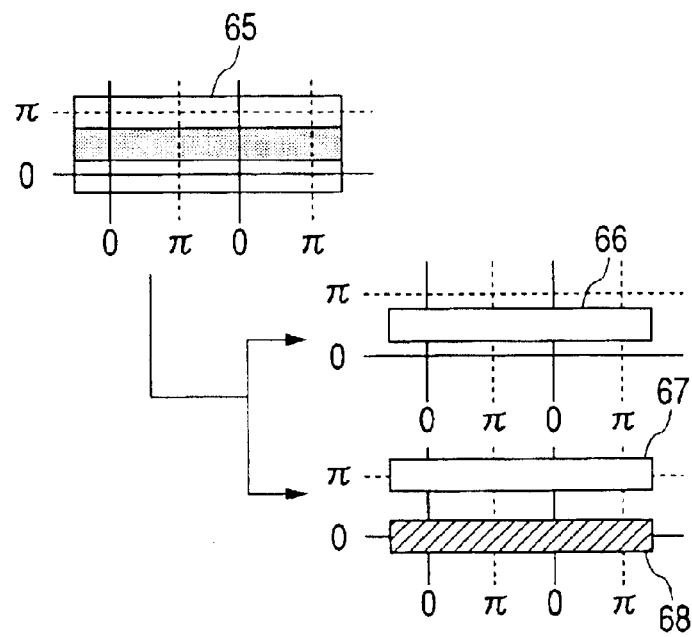
FIG. 5 is a pattern plane view showing still other principle of the invention.

When adjacent lattice lines on the basic lattice belong to the same pattern, the phase conflict of type C is caused between two pieces of the lattice lines included in the pattern. The phase conflict of this type is resolved by decomposing an original pattern (upper stage of FIG. 5) into two sheets of mask patterns as shown by a middle stage and a lower stage of FIG. 5 by arrow marks and subjecting the mask patterns to multiple exposure to the same resist film. That is, a first mask (middle stage of FIG. 5) is formed with a pattern 66 corresponding to a portion of the phase conflict, that is, a portion interposed by two lattice lines and a second mask (lower stage of FIG. 5) is formed with phase-shifting patterns 67 and 68 corresponding to portions of other line. Thereby, the phase conflict of type C is resolved.

Further, the above-described portion is not necessarily needed to be interposed by wirings having a minimum line width along the basic lattice but can be dealt with by applying the above-described method even in the case in which the above-described portion is brought into contact therewith on one side thereof.

A pattern for resolving the phase conflict of type A or B and a pattern for resolving the phase conflict of type C can be arranged on one sheet of the same mask. However, whereas the pattern for resolving the phase conflict of type A or B is arranged on the lattice point of the basic lattice, the pattern for resolving the phase conflict of type C is arranged between the lattices of the basic lattice in a shape of line. Therefore, some caution is required when these are arranged on one sheet of the same mask to thereby arrange phases.

For example, in a case of a mixed pattern of a bold wiring 70 and wirings 71 and 72 having a minimum width, a pattern for resolving the phase conflict of type A or B and a pattern for resolving the phase conflict of type C are brought into contact with each other and therefore, it is difficult to arrange phases.

Figure 6:
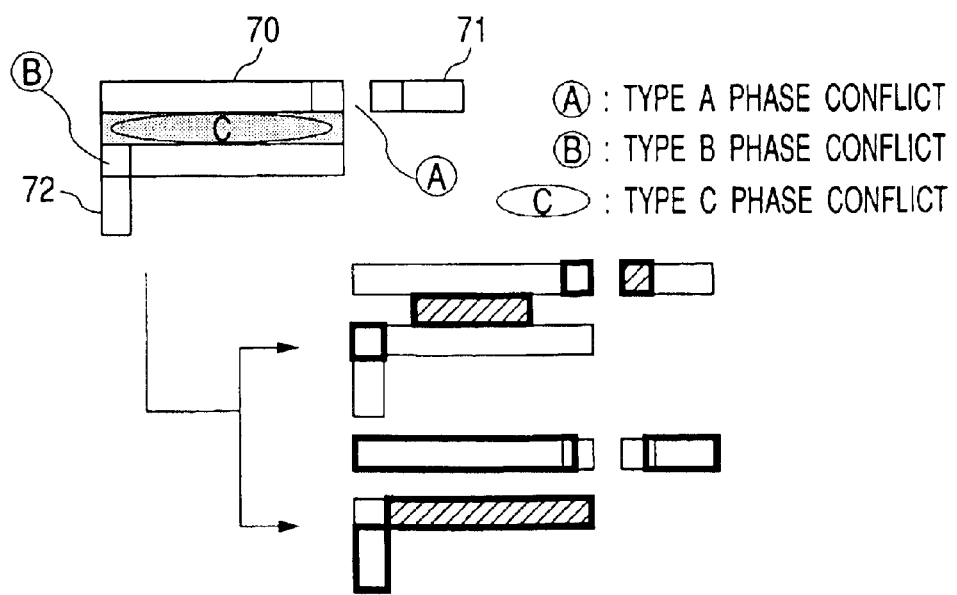
FIG. 6 is a pattern plane view showing a case of applying the invention to a complicated pattern.

In this case, in consideration of functions of the bold wiring and connection points priority is given to resolution of the phase conflict of type A or B at a vicinity of a terminal end of a wiring and there may be formed two sheets of masks of arrangements as shown at a middle stage and a lower stage of FIG. 6 indicated by arrows.

That is, as a pattern for resolving the phase conflict of type C, there may be used a feature contracting a pattern of the bold line portion 70 respectively by about one side W (=half of basic period) in a wiring width direction and about one side 2W in a wiring longitudinal direction.

Thereby, at a distal end portion (front end portion, terminal end portion), the phase conflict of type A or B is resolved and connection with other wiring or via or the like can firmly be carried out, meanwhile, at portions other than the distal end, by resolving the phase conflict of type C, the bold wiring can be realized to thereby reduce wiring resistance.

Next, a description will be given of a case of applying the invention to a pattern of a further general arrangement in which a pattern is present also among the basic lattice. First, there is defined a sub-lattice at a position shifted from the basic lattice by a half period respectively in vertical and horizontal directions.

Figure 7:
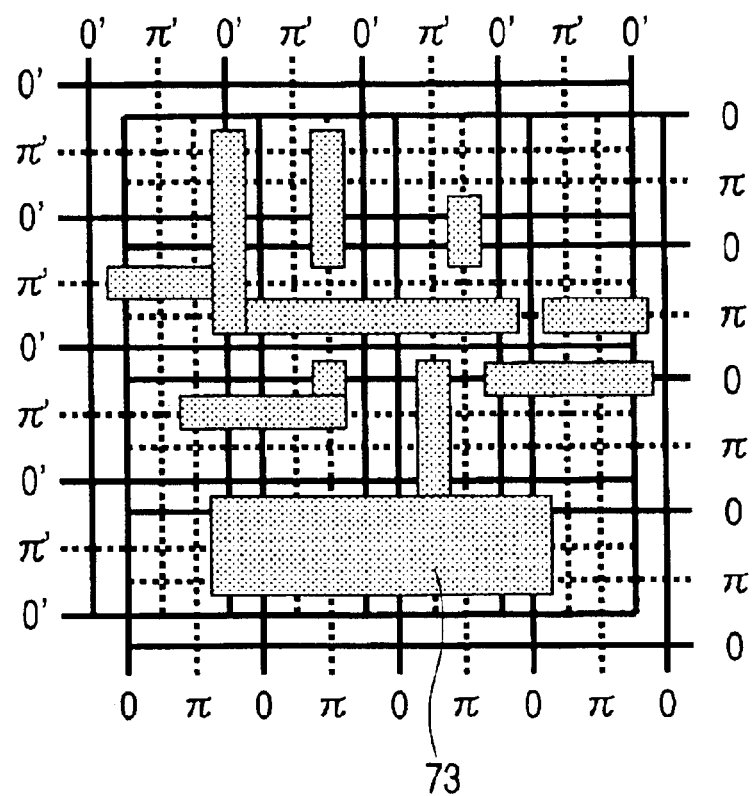
FIG. 7 is a plane view schematically showing a complicated wiring pattern constituting an object to which the invention is applied.
Figure 8:
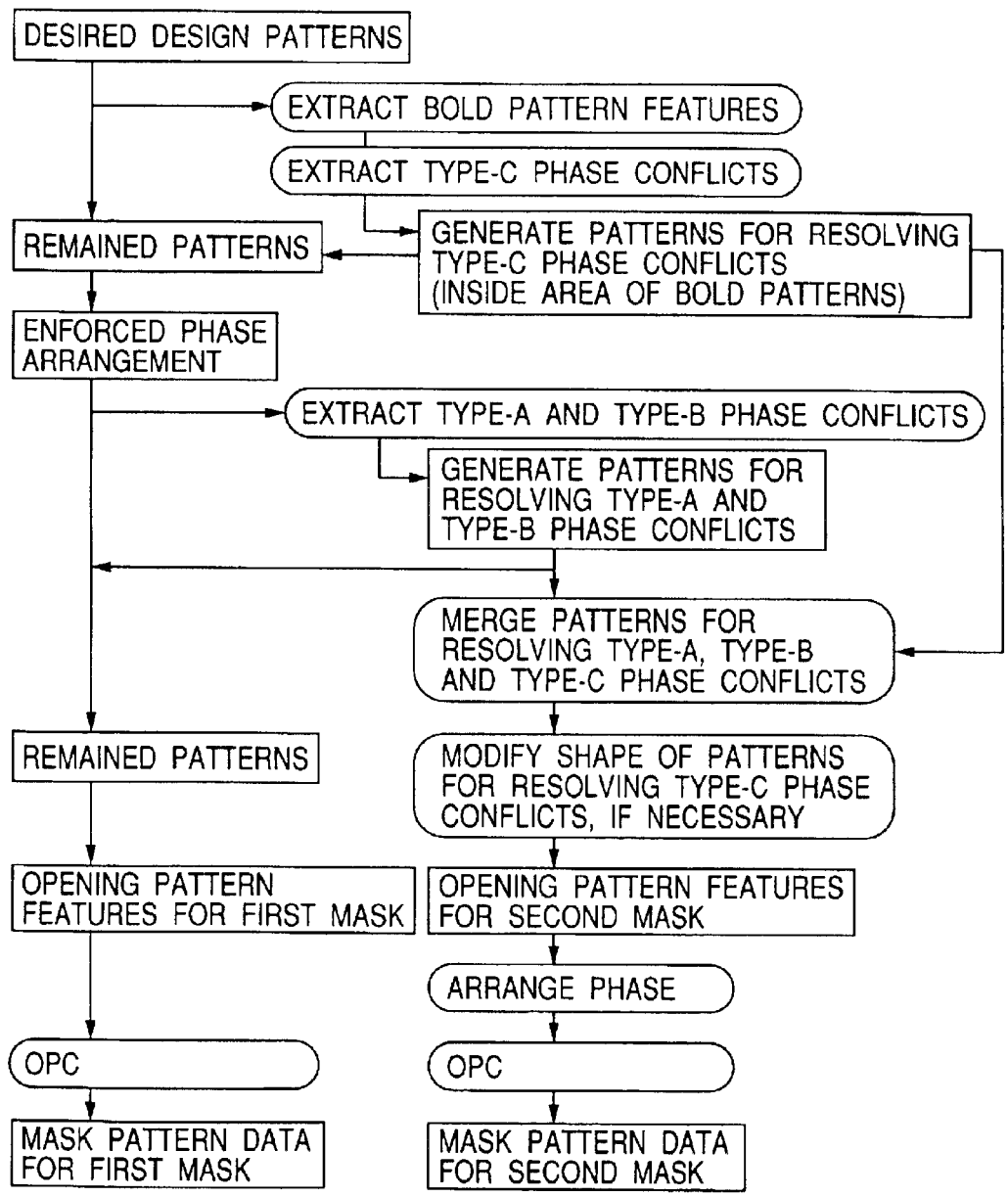
FIG. 8 is a flowchart showing a procedure of a case of applying the invention to a general pattern.

Assume that a design pattern is constituted by a combination (sum region) of line segments having a width W (=half of basic period) on the basic lattice and line segments having a width W on the sub-lattice as shown by FIG. 7. FIG. 8 shows a total flow of processings in this case.

First, features of a bold pattern 73 are extracted from a pattern firstly constituting an object and a pattern for resolving the conflict of type C is generated based on the above-described method. Next, when the above-described pattern of resolving the conflict of type C is excluded from the original pattern, there remain patterns having a minimum line width on the basic lattice and the sub-lattice.

Figure 9:
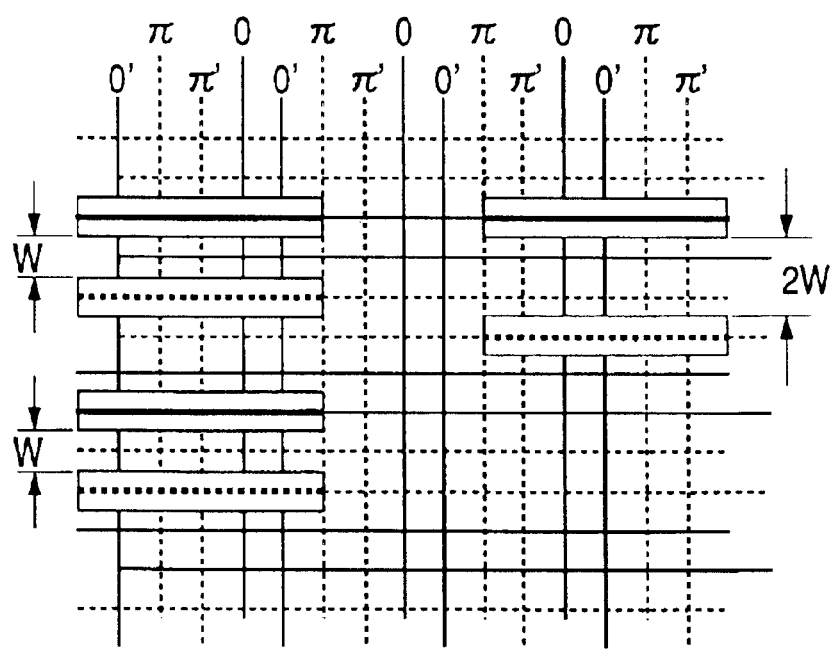
FIG. 9 is a schematic view showing an effect of a case of applying the invention to a general pattern.

When the sub-lattice is divided into lattices 0' and lattices π' similar to the pattern on the basic lattice, the above-described pattern belongs to any one of lattices 0, lattices π, lattices 0' and lattices π'. Therefore, by forcibly arranging phases in accordance with the above-described lattices, both of the phase conflicts of type A and type B can be caused respectively between patterns belonging to the basic lattice, patterns belonging to the sub-lattice and between patterns belonging to the basic lattice and patterns belonging to the sub-lattice. Hence, phase conflicts of type A and type B are extracted and there are generated conflict resolving patterns with regard to these conflicts based on the above-described method. The conflict resolving patterns are removed from the original pattern as necessary and this is defined as a first phase mask. Further, conflict resolving patterns of types A, B and C are arranged on one sheet of the same mask and defined as a second phase mask. A description will be given as follows of a method of arranging phases in the respective masks. Although it is preferable to apply pertinent optical proximity effect correction (OPC) for individual pattern shapes on the respective masks, a description will later be given with regard thereto. First, according to the first phase mask, as shown by FIG. 9, whereas a minimum line interval between patterns on the basic lattice and patterns on the sub-lattice, is a half W of the basic pitch, a distance between a pattern on the basic lattice and a pattern on the sub-lattice independent from each other, is at least equal to or larger than twice (2W) of the minimum interval.

Although according to the invention, W is defined to be about a minimum resolvable dimension of phase shifting at minimum, in this case, patterns having an interval therebetween separated by about 2W can always be separated without depending on a phase relationship of both. Therefore, a pattern on the basic lattice and a pattern on the sub-lattice pose no problem when the patterns are arranged on one sheet of the same mask. That is, line patterns excluding phase conflict portions on the respective lattices can be arranged on one sheet of the same first phase mask. The phase of the respective pattern can be determined by, for example, on which of lattice 0, lattice $\pi$, lattice 0' and lattice $\pi$' the individual pattern is present. Next, consider various kinds of patterns for resolving phase conflicts (pattern features) in the above-described second phase mask. The conflict of type A can be caused any of between lattice points having the same phase of the basic lattice, between lattice points having the same phase of the sub-lattice and between a lattice point of the basic lattice and a lattice point of the sub-lattice having a phase the same as a phase of the lattice point of the basic lattice. When these are classified respectively as types A-1, A-2 and A-3, although a minimum distance between conflicts of the same type is equal to a minimum resolvable dimension of phase shifting, there is a possibility that a distance between conflict resolving patterns of different types becomes 0 as shown by FIG. 10($a$).

Figure 10A:
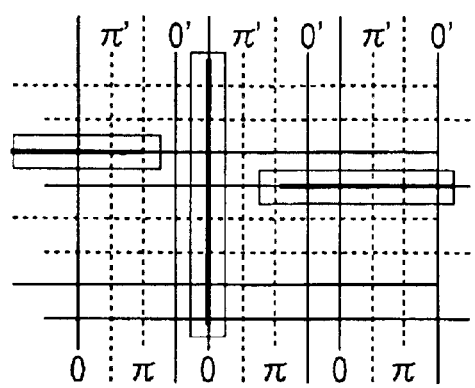
FIGS. 10(a) and 10(b) are schematic views showing a problem in a case of applying the invention to a general pattern.
Figure 10B:
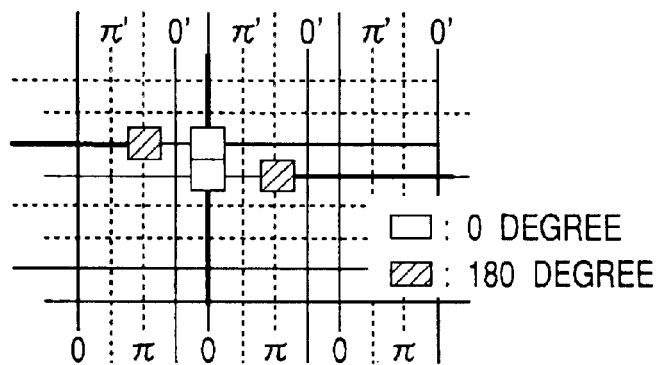
Figure 11:
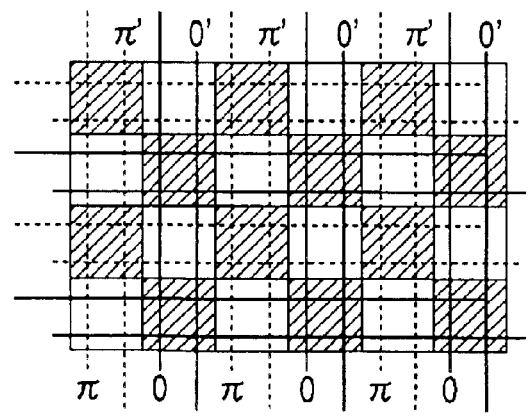
FIG. 11 is a schematic view showing a resolution method in a case of applying the invention to a general pattern.

In this case, it is necessary to arrange phases of the conflict resolving mask such that phases of conflict resolving patterns in contact with each other are equal to each other as shown by, for example, FIG. 10($b$). This is carried out by setting phases on the conflict resolving masks corresponding to lattice points having different phases of vertical and horizontal lines, become always equal to each other regardless of the basic lattice or the sub-lattice as shown by FIG. 11.

Thereby, even when A-1 and A-3 are brought into contact with each other as shown by FIG. 10, the phases of the conflict resolving patterns in contact with each other can be made equal to each other. In view of respectives of lattice points of the basic lattice, lattice points of the sub-lattice, intersections of vertical basic lattice and horizontal sub-lattice and intersections of horizontal basic lattice and vertical sub-lattice, phases are arranged in a shape of a checker flag and a minimum distance thereof is equal to the minimum resolvable dimension of phase shifting. Therefore, conflict resolving patterns at other than portions in contact with each other can always be separated and resolved.

Also phase conflict of type B can be defined and resolved quite similar to a case of only the basic lattice. That is, regardless of the basic lattice or the sub-lattice, intersections of patterns of phase 0 and phase $\pi$ constitute the phase conflict of type B. Among them, phase conflicts on the basic lattice or phase conflicts on the sub-lattice are arranged at the period of the basic lattice, there is a possibility that a minimum distance of conflict between the basic lattice and the sub-lattice and between the same lattices becomes 0 and the conflicts are brought into contact with each other (FIG.

Figure 12A:
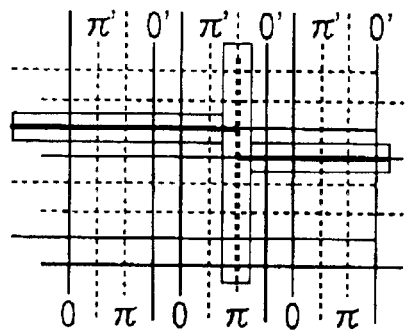
FIGS. 12(a) and 12(b) are schematic views showing other problem in a case of applying the invention to a general pattern.
Figure 12B:
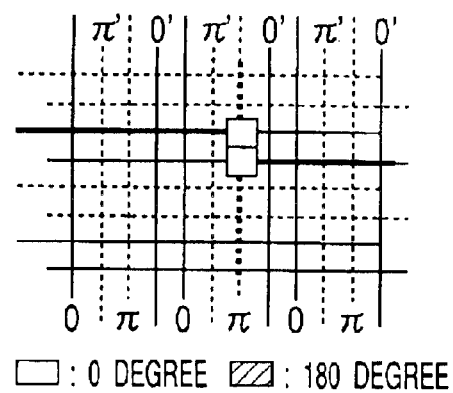

12($a$)). In this case, it is necessary to arrange phases of a conflict resolving mask as shown by FIG. 12($b$) such that phases of the conflict resolving patterns in contact with each other become equal. This can be carried out by setting phases on the conflict resolving mask as shown by FIG. 11 quite similar to that for the above-described conflict of type A.

Figure 13A:
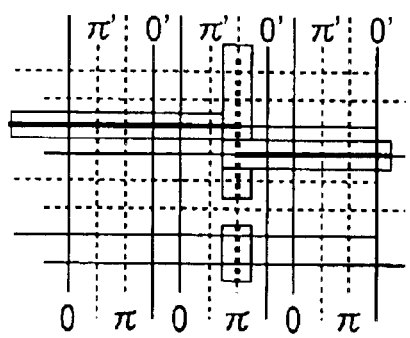
FIGS. 13(a) and 13(b) are schematic views showing other problem in a case of applying the invention to a general pattern.
Figure 13B:
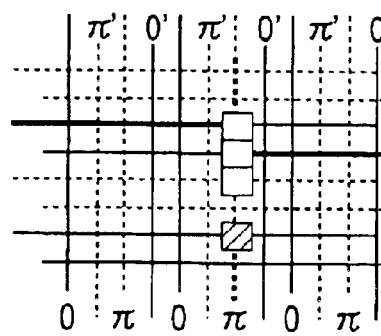

FIG. 13 shows an example of an exceptional case of causing phase conflict between phase resolving patterns by the phase arranging method shown in FIG. 11. According to patterns shown in FIG. 13($a$), conflict resolving patterns are present at three lattice points consecutive in one direction on the basic lattice. According to phase arrangement in such a case, it is preferable to make all of phases of the three consecutive phase conflict resolving patterns equal to each other as shown by FIG. 13($b$) without depending on the method of FIG. 11.

Figure 26:
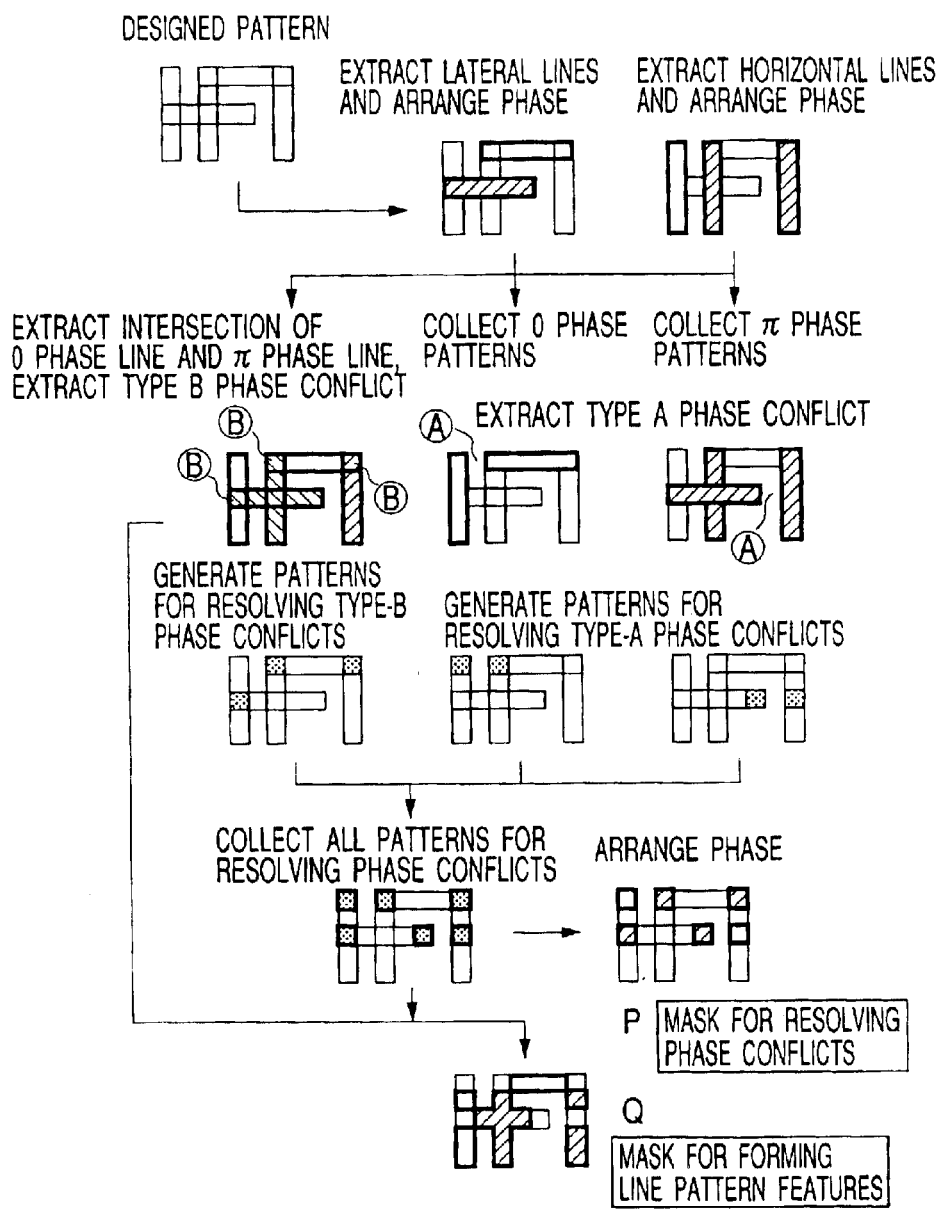
FIG. 26 is a schematic view showing an example of a pattern generating algorism according to the invention.

Although geometrical processings in this case are complicated, in many cases, such a complicated wiring pattern is a wiring at inside of a logical cell and therefore, the problem may be dealt with by extracting conflicts in designing the cell and correcting the design individually. When the inter-cell wirings are mixed, it is preferable to arrange phases on a premise of connecting the wirings to terminals in the cell. All of the above-described operation can be formed into a rule by the geometrical operation and accordingly, operation can automatically be carried out by what is called automatic geometrical operation tool. FIG. 26 shows an example of a basic algorism. A specific program will later be given by embodiments. Further, for simplification, in FIG. 26, a bold line pattern and a pattern between the basic lattice are omitted.

That is, as shown by an arrow mark on the right side of an original designed pattern shown at top left of FIG. 26, lateral lines are extracted and phase arrangement with regard thereto is set and horizontal lines are extracted and phase arrangement with regard thereto is set. Successively, as shown by arrow marks therebelow, intersections of phases 0/$\pi$ are extracted and the above-described portions of phase conflict of type B are extracted and 0 phase patterns and phase $\pi$ patterns are collected to thereby extract the above-described portions of phase conflict of type A. Based on the result, patterns for resolving respective phase conflicts are generated and as shown by an arrow mark, and patterns for resolving phase conflicts are collected. Further, a first mask P for resolving phase conflicts is formed by allocating proper phase arrangement to the collected patterns for resolving phase conflicts and further, a second mask Q for forming line pattern features is formed by subtracting the collected patterns for resolving phase conflicts from the collected pattern of the horizontal and lateral lines.

Further, in order to simplify generation of remaining pattern data other than predetermined pattern by subtracting predetermined pattern data from original pattern data, the operation is referred to as generating complimentary patterns.

Figure 14A:
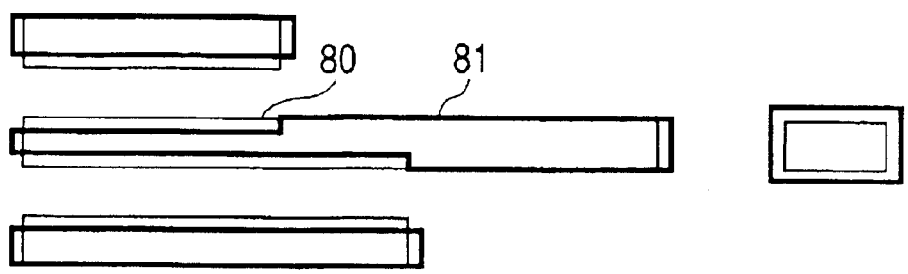
FIGS. 14(a), 14(b) and 14(c) are schematic views showing various examples of pattern correcting means applicable to the invention.
Figure 14B:
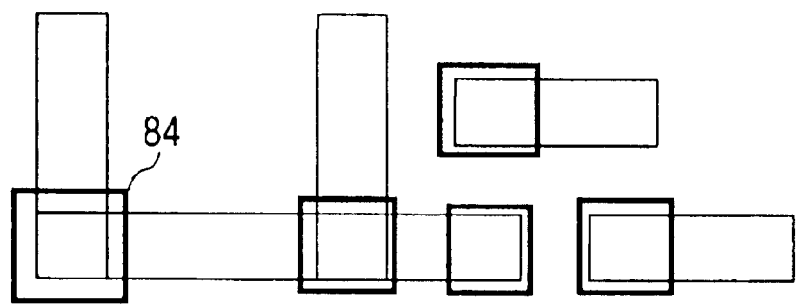
Figure 14C:
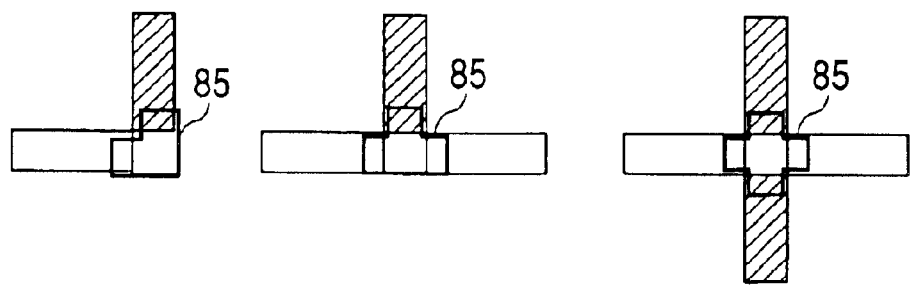

Meanwhile, according to the first phase mask, there are generated patterns of various shapes from a square shape to line and space patterns. It is generally difficult as miniaturization is progressed to form the various patterns simultaneously and accurately. In order to resolve this, it is preferable to carry out optical proximity effect correction (OPC). FIG. 14 shows an example of OPC applicable to the invention.

FIG. 14($a$) shows an example of OPC with regard to a pattern on a mask for a line pattern. A thin line 80 in the drawing shows an original design pattern and a bold line 81 shows a shape of a pattern after correction. For example, it is preferable that a line width of an isolated pattern having a large distance to an adjacent pattern, is made bolder than a line width of a crowded pattern having a comparatively small distance and a line width of a line pattern having a short length and a dimension of a very small pattern in a square shape is relatively made large. Although according to the invention, it is necessarily needed to add a very small correction pattern of what is called hammer head, serif or the like to an individual pattern on a mask, even when the very small correction pattern is added, no trouble is brought about.

FIGS. 14(*b*) and 14(*c*) show an example of OPC with regard to patterns on the above-described mask for resolving conflicts. Although the pattern for resolving conflicts is basically a very small pattern in a square shape, it is preferable to pertinently change a size and a shape thereof in accordance with the type of phase conflict, a distance to an adjacent pattern or the like as shown by a bold line 84. Particularly, a pattern for resolving phase conflict of type B is for connecting two through four pieces of patterns to each other and therefore, it is effective to correct the pattern in accordance with the object such as constituting various shapes as shown by bold lines 85 of FIG. 14(*c*).

Figure 15A:
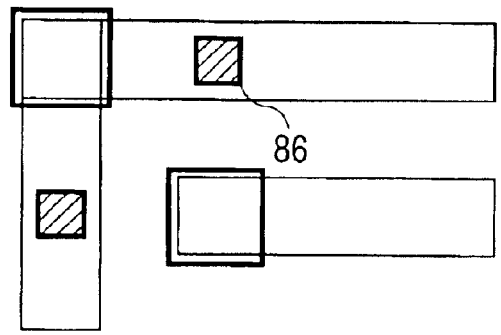
FIGS. 15(a), 15(b) and 15(c) are schematic views showing other various examples of pattern correcting means applicable to the invention.
Figure 15B:
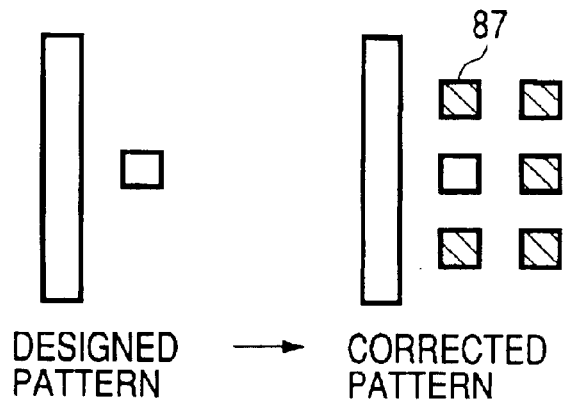
Figure 15C:
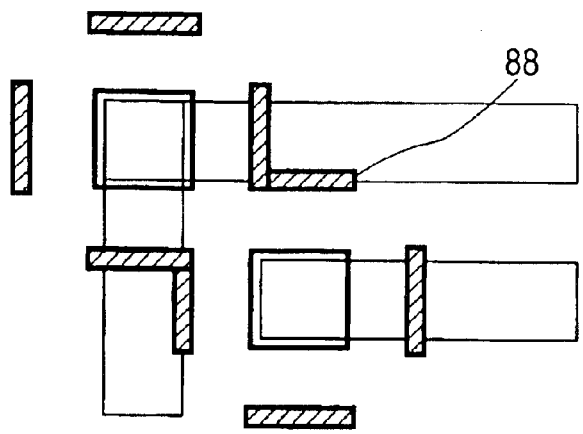

Further, when the pattern for resolving conflicts are present to isolate, in order prevent projected images thereof from being widened to surroundings, a peripheral node pattern 86 as shown by FIG. 15(*a*) may be added. When no problem is guaranteed in view of circuit function, the peripheral node patterns 86 may be arranged at regions where patterns are not present in view of design.

Further, with regard to a very small pattern in a square shape originally present on a designed pattern, a very small square dummy pattern 87 may previously be arranged on a lattice point of a portion where wiring patterns are not present at a surrounding thereof (FIG. 15(*b*)). Phase arrangement of the dummy pattern 87 may be carried out in accordance with phases of lattices.

Although the peripheral node patterns 86 or the dummy patterns 87 may be resolved by themselves, there can be constituted a very small auxiliary pattern 88 which cannot be resolved by itself as shown by FIG. 15(*c*). A position of the auxiliary pattern 88 in this case is not necessarily needed to dispose on an adjacent lattice point but it is preferable to pertinently optimize a distance from a center of a phase conflict resolving pattern and a shape thereof.

By adding the various OPC methods explained above, accuracy of a finished pattern and honesty for a designed pattern can further be promoted.

Figure 16:
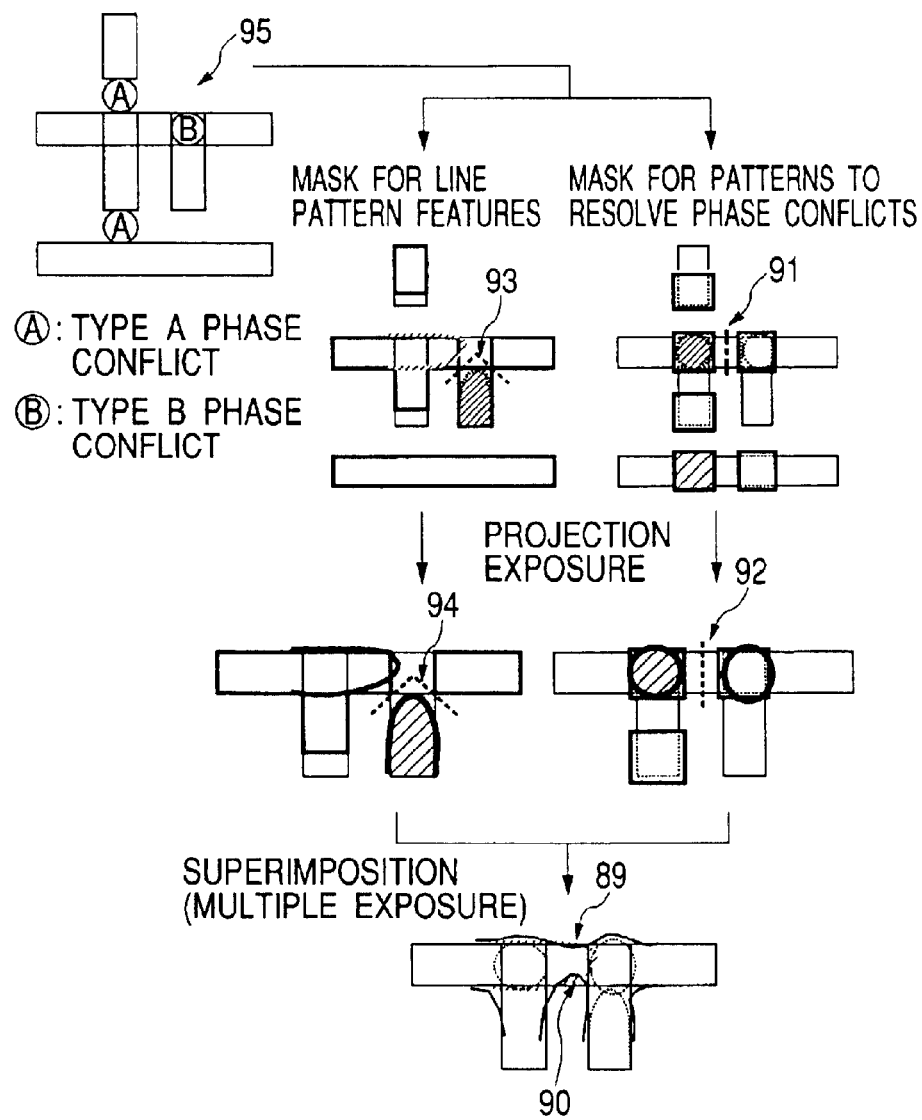
FIG. 16 is a schematic view showing other problem in a case of applying the invention to a general pattern.

Further, in the case in which other phase conflict resolving pattern or peripheral node pattern is arranged at a position of a lattice point adjacent to a phase conflict resolving pattern of type B as shown at upper left of FIG. 16, when a photoresist film is subjected to projection exposure by using two masks of a mask for line pattern features and a mask for patterns to resolve phase conflicts as shown by a second stage of FIG. 16 by arrow marks, as shown by a lowermost stage of FIG. 16 by an arrow mark, there is a concern of causing constrictions 89 and 90 at the pattern of the finished photoresist film. This is because whereas according to a projected image formed by the mask for patterns to resolve phase conflicts, as shown by the second stage and a third stage of FIG. 16, the optical intensity becomes 0 at positions of dotted lines 91 and 92, according to the mask for line pattern features, as shown by dotted lines 93 and 94 in the drawing, the optical intensity becomes 0 at middles of vertical and horizontal lines phases of which are reverse, that is, on skewed 45 degree lines of intersections and positions of the two masks where the optical intensity becomes 0, are proximate to each other, or at a position where the optical intensity becomes 0 at one of the masks, the optical intensity of an image of other mask is not sufficient provided.

Figure 17:
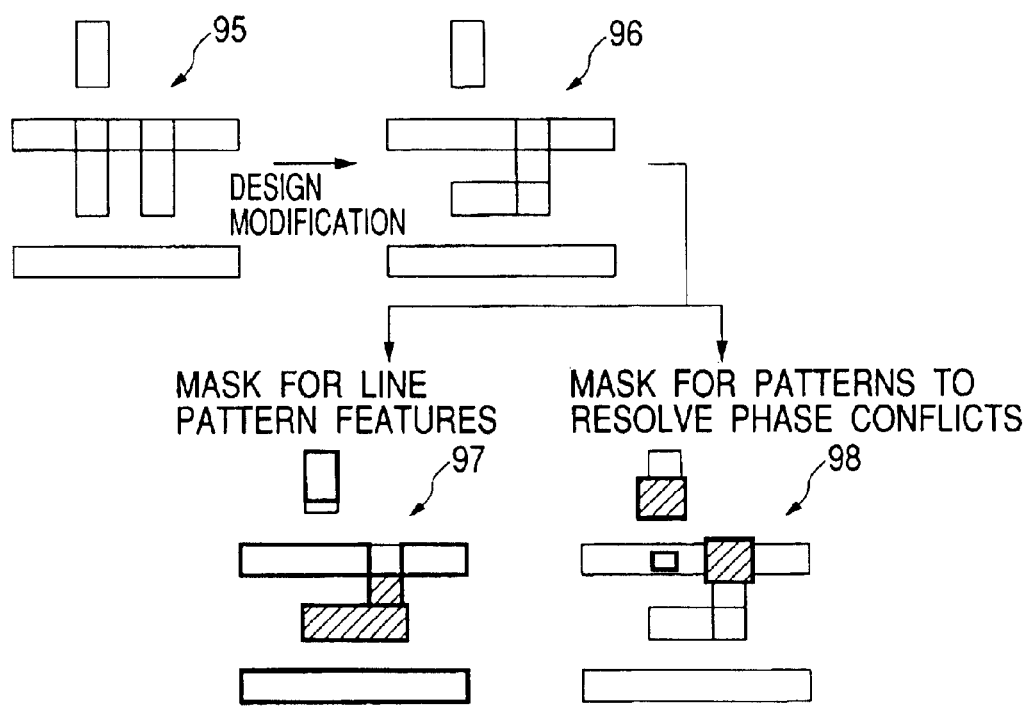
FIG. 17 is a schematic view showing one resolution method of other problem of the invention.

When the constriction pattern poses a problem, as shown by FIG. 17, it is conceivable that pattern arrangement per se of an original pattern 95 at upper left of FIG. 17 is changed as shown by upper right thereof (96) and two sheets of masks of a mask 97 for line pattern features and a mask 98 for patterns to resolve phase conflicts are formed as shown at a lower stage of FIG. 17 by arrow marks. Such a measure can be carried out when patterns are designed manually as in wirings at inside of a cell.

However, when the change is carried out by returning to a designed pattern, the change is troublesome from the view point of design flow, which may not necessarily be preferable.

Figure 18:
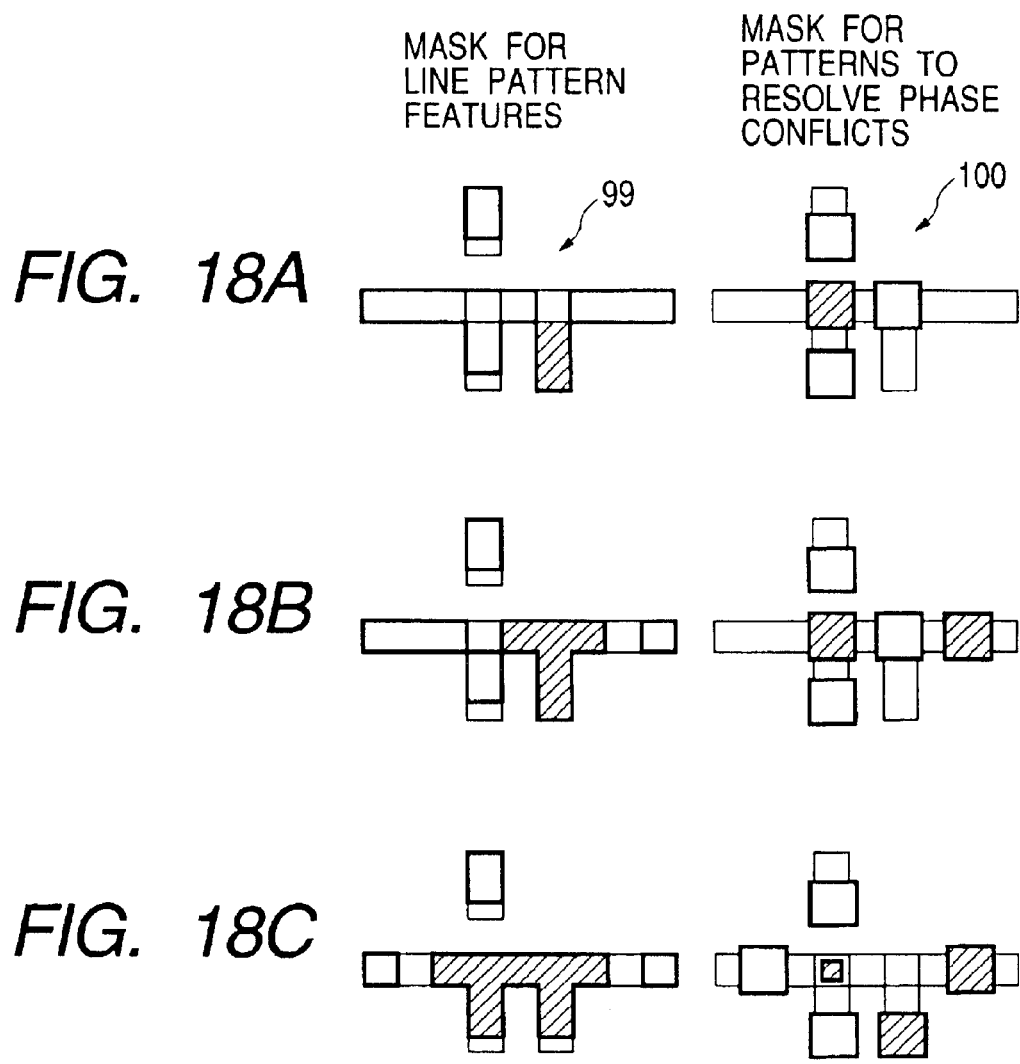
FIGS. 18(a), 18(b) and 18(c) are schematic views showing other resolution method of other problem of the invention.

Hence, in this case, the pattern to resolve phase conflicts of type B may be improved as shown by FIG. 18. Further, in FIGS. 18(*a*), 18(*b*) and 18(*c*), a mask 99 for line pattern features is shown on the left side and a mask 100 for patterns to resolve phase conflicts is shown on the right side. FIG. 18(*a*) shows decomposition of mask patterns before the improvement and FIGS. 18(*b*) and 18(*c*) show a result of decomposing mask patterns after improvement.

First, according to an improvement method shown in FIG. 18(*b*), actual phase conflict is shifted not to an intersection (or corner) of lattice 0 and lattice π but onto a lattice point at a position shifted from a corner by one period of the basic lattice. Thereby, the problem as shown by FIG. 16 can be resolved.

Further, according to an improvement method show by FIG. 18(*c*), when a T-shape intersection is arranged on a plurality of consecutive lattice points, these are dealt with as a feature having the same phase. A pattern for resolving phase conflicts is set to a lattice point on an outer side of a lattice point on an outer side of the consecutive lattice points. The method may be carried out only when horizontal line portions of characters of T (heads) of consecutive T-shape intersections, are aligned on a straight line as shown by FIG. 18(*c*). When the restriction is not carried out, there is a concern of causing phase conflicts among the line patterns and therefore, caution is required.

By further generalizing the improvement method shown by FIG. 18(*b*) as follows, processings can be automated. According to the method described above (refer to FIG. 3), the phase conflict of type B is resolved by constituting only an intersection causing the conflict by separate mask. However, a pattern for resolving phase conflict of type B is not limited to the pattern shown in FIG. 3 but FIG. 3 only shows the simplest of conceivable conflict resolving patterns. Hence, in this case, there is utilized other pattern for resolving the phase conflict of type B. Basically, a predetermined range centering on a pattern intersection causing a phase conflict of type B, is replaced by a predetermined conflict resolving pattern. In this case, the above-described conflict resolving pattern can be constituted by a combination of patterns on a first mask and patterns on a second mask.

Figure 19:
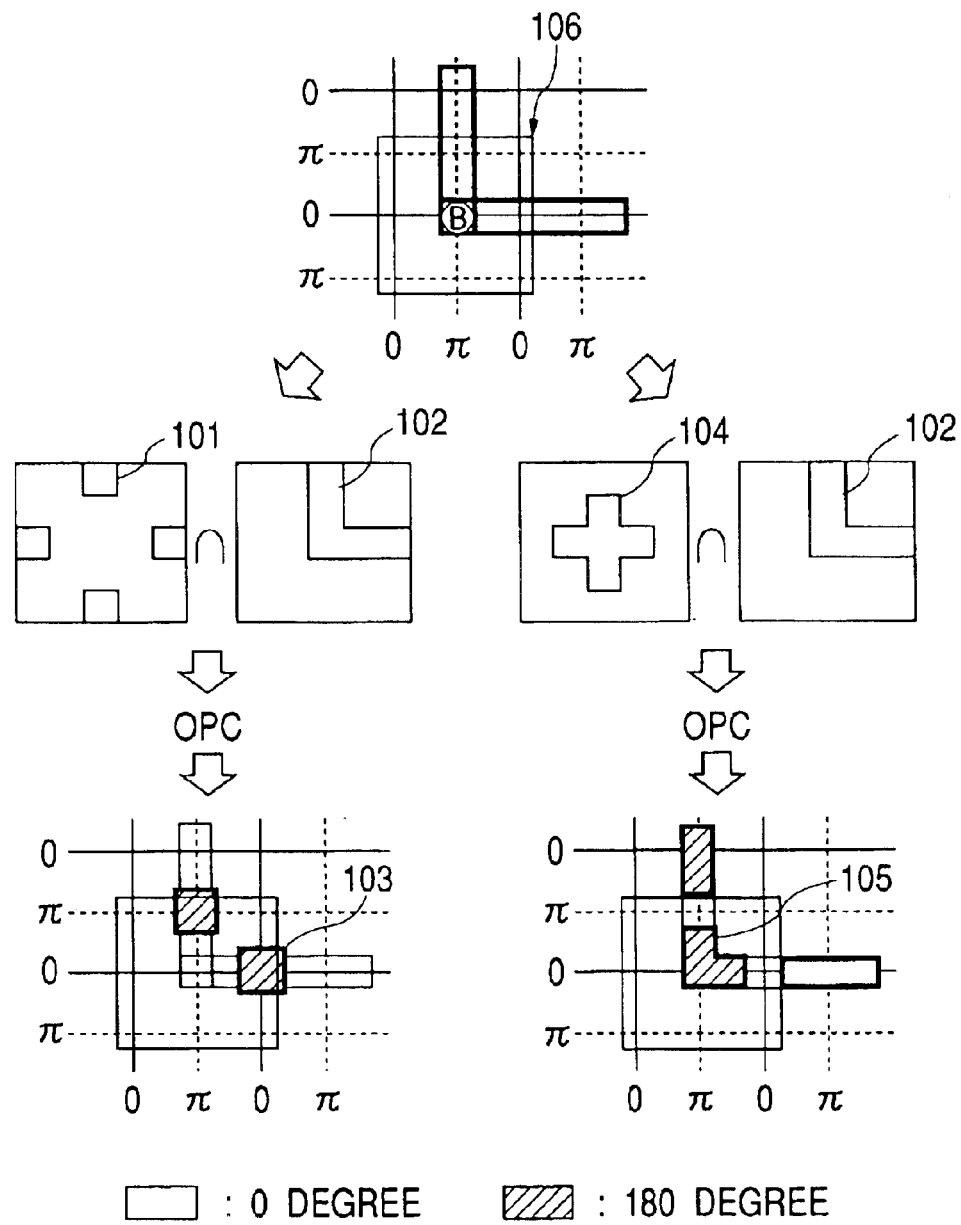
FIG. 19 is a schematic view showing other problem and a resolution method thereof of the invention.

FIG. 19 shows an example of a pattern for resolving conflict of type B and a method of generating the pattern. A pattern at inside of a square shape 106 written by a thin line at a topmost stage of FIG. 19 centering on a portion of phase conflict of type B, is replaced by a pattern for resolving phase conflict generated by the following procedure as shown by arrow marks in the drawing.

First, a pattern 103 for resolving phase conflict of type B on a mask for resolving phase conflict is constituted by calculating a common region of a pattern 101 and a designed pattern 102 and pertinently correcting a shape thereof. Further, a pattern 105 for resolving phase conflict of type B on a mask for forming line portion features, is constituted by calculating a common region of a pattern 104 and a designed pattern 102 and pertinently correcting a shape thereof. The patterns for resolving phase conflicts of type B on the respective masks, are fitted to inside of a square shape written by a thin line and made to merge to patterns on an outer side thereof. Phases of the patterns for resolving phase conflicts of type B on the mask for resolving phase conflicts can be determined based on coordinates of lattice points at which respective patterns are placed.

Although any phases will do for the pattern 105 for resolving phase conflicts on the mask for forming line portion features, the phases can be determined, for example, based on, coordinates of lattice points causing the phase conflicts.

According to the method, an opening pattern is necessarily generated at a lattice adjacent to the portion of conflict of type B on the mask for resolving phase conflict and therefore, even when other phase conflict is present neighbourly to the above-described conflict of type B, the other phase conflict can be resolved without problem.

Figure 20:
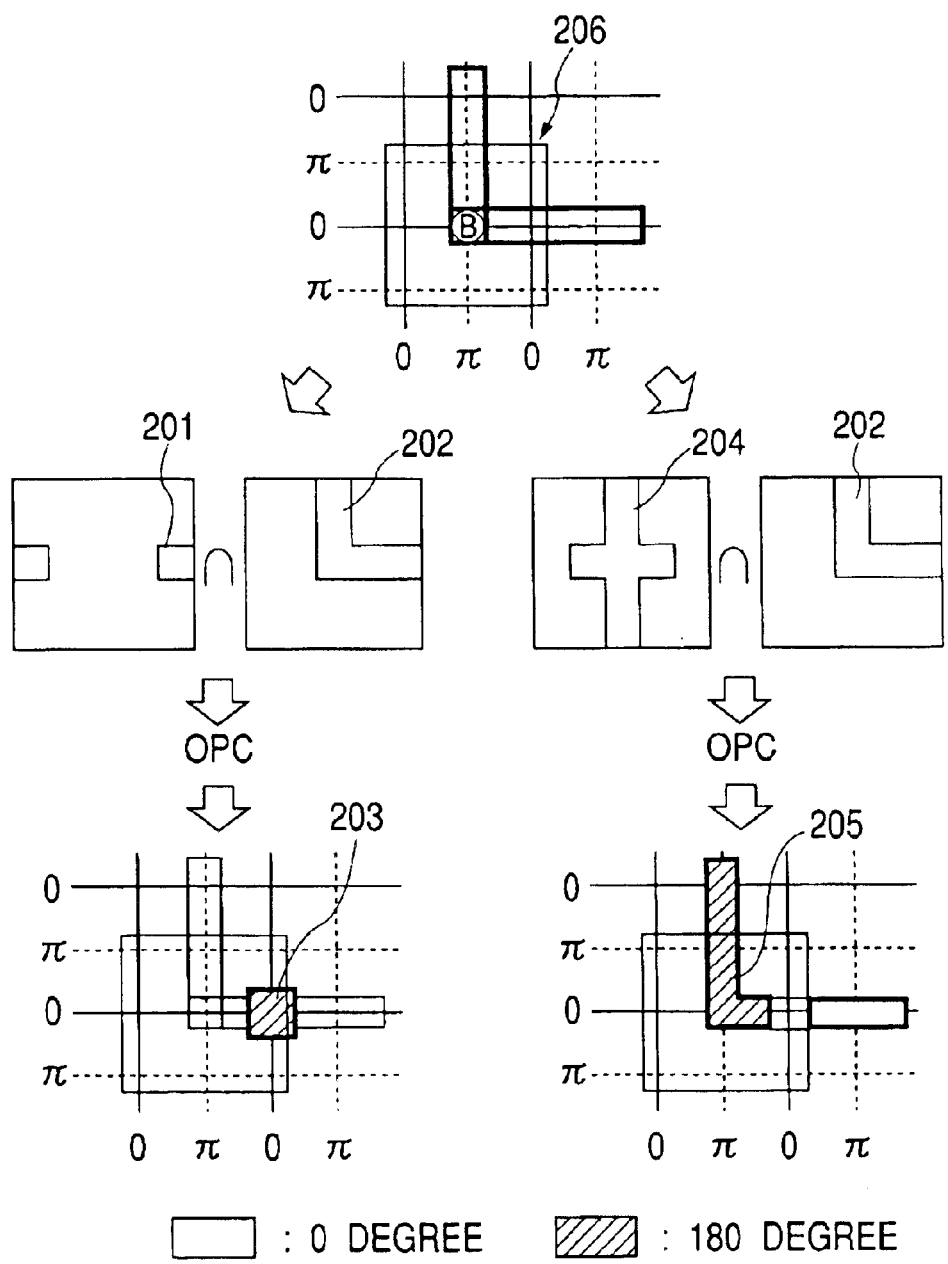
FIG. 20 is a schematic view showing other problem and a resolution method thereof of the invention.

Similarly, FIG. 20 shows other pattern of resolving phase conflicts and a procedure of generating the pattern. According to the method of FIG. 20, by directly connecting patterns of the same phase on an inner side and an outer side of a thin line 206 on a mask for forming the line portion features, an amount of pattern data can be restrained. Further, the above-described pattern of FIG. 18(c) is provided by applying the method shown in FIG. 20.

Further, also with regard to the method shown in FIG. 18(c) the method can be generalized as follows. A proximate pattern of T-shape crossings horizontal line portions of which are aligned and adjacent to a straight line, is extracted and allocated with phases as a single aggregation. The phases can be determined by, for example, from phases of lattices at the horizontal line portions aligned on the straight line. Next, the pattern is collected to other portion of a circuit pattern subjected to phase arrangement forcibly. As a result of collecting, new phase conflict is caused between a portion allocated with the phases as the single aggregation and other portions and therefore, the conflict resolving pattern may be generated at contact portions.

According to the above-described explanation, it is assumed that all the patterns excluding the inner portion of the bold line, is firstly subjected to phase arrangement forcibly. However, actually, the phase arrangement may be limited to a minimum necessary range. This is achieved by, for example, a method shown in FIG. 27.

Figure 27:
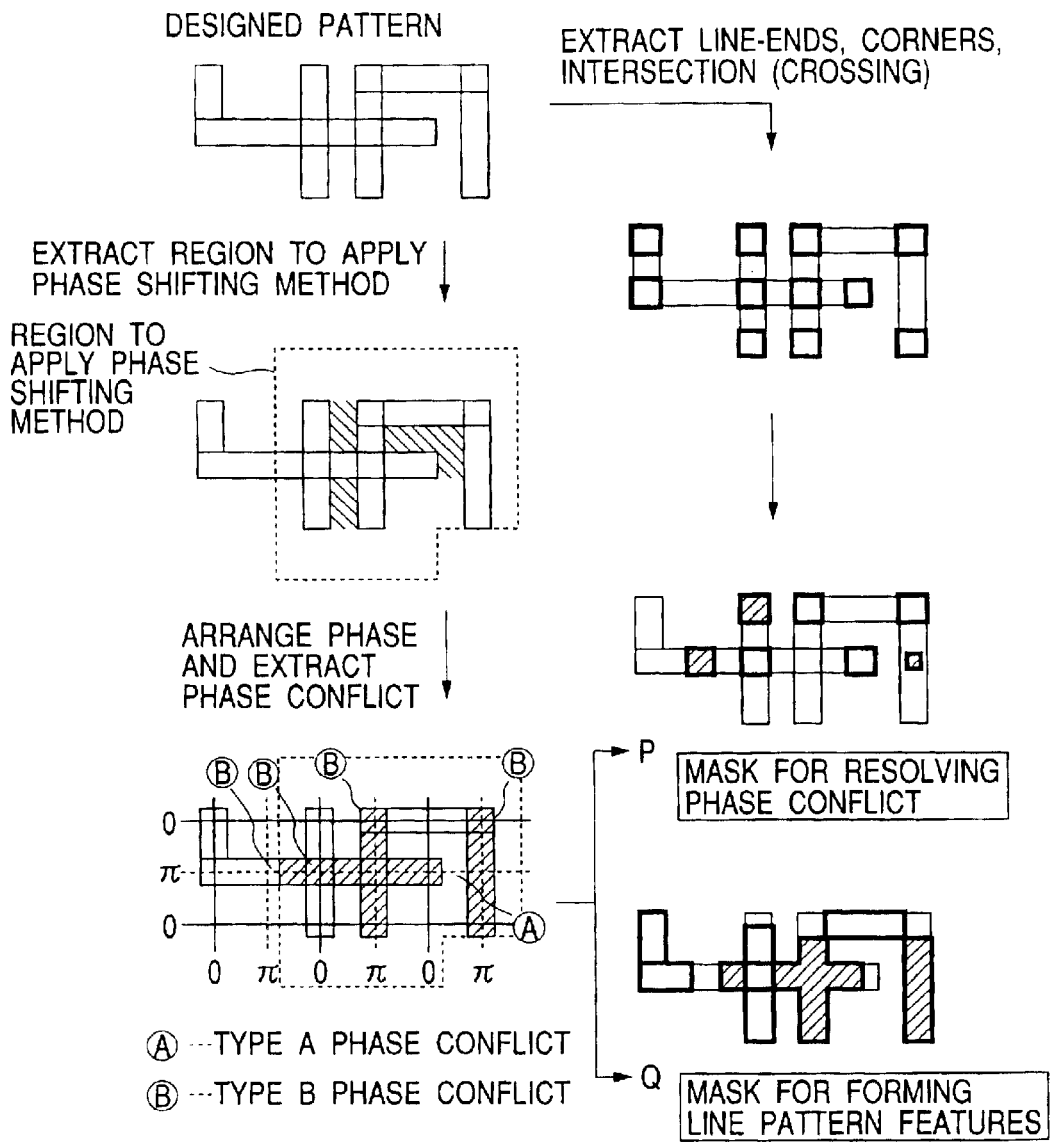
FIG. 27 is a schematic view showing other example of a pattern generating algorism according to the invention.

First, there are extracted characteristics of line-ends, corners, intersections and the like from an original designed pattern at left upper of FIG. 27. Further, patterns proximate to each other within a certain distance are extracted and vicinities thereof are made to constitute a phase shifting applying region. Further, whereas phase arrangement is carried out for the phase shifting applying region in accordance with the procedure shown by FIG. 8, FIG. 26, FIG. 18 or the like, with regard to patterns other than the phase shifting applying region, for example, phase 0 degree is allocated. Thereafter, patterns at inside of the phase shifting applying region and at outside of the region respectively allocated with phases, are collected. As a result of collecting, phase conflicts are caused and therefore, the phase conflicts are extracted and patterns for resolving phase conflicts are generated. Caution is particularly required in dealing with contact points of a pattern having phase π at inside of the phase shifting applying region and a pattern at outside of the phase shifting applying region allocated with phase 0 degree, as new phase conflict of type B. In this way, there are formed two sheets of masks of a first mask P for resolving phase conflicts and a second mask Q for forming line pattern features.

By minimizing the phase-shifting region in this way, yield of manufacturing masks can be promoted by restraining a density of defects of, for example, the phase-shifting mask. This is because when, for example, an engraving portion of a phase mask is constituted by a region of phase π, by minimizing an area of the engraving region, a number of defects in etching the substrate in the region can be restrained.

Further, according to the invention, a resolving pattern may be generated by extracting only minimum necessary portions or a resolving pattern may be generated by extracting all of portions which may cause conflicts. For example, in the case of a pattern 111 shown at an upper stage of FIG. 21, when a conflict resolving pattern is generated by extracting only conflict portions, the original pattern 111 is decomposed into two sheets of masks 112 and 113 as shown by lower left of FIG. 21 by arrow marks. In this case, a proximity effect correction of adding a hammer head or the like as shown in the drawing can also be carried out for a pattern having a reverse phase caused on the second mask.

Figure 21:
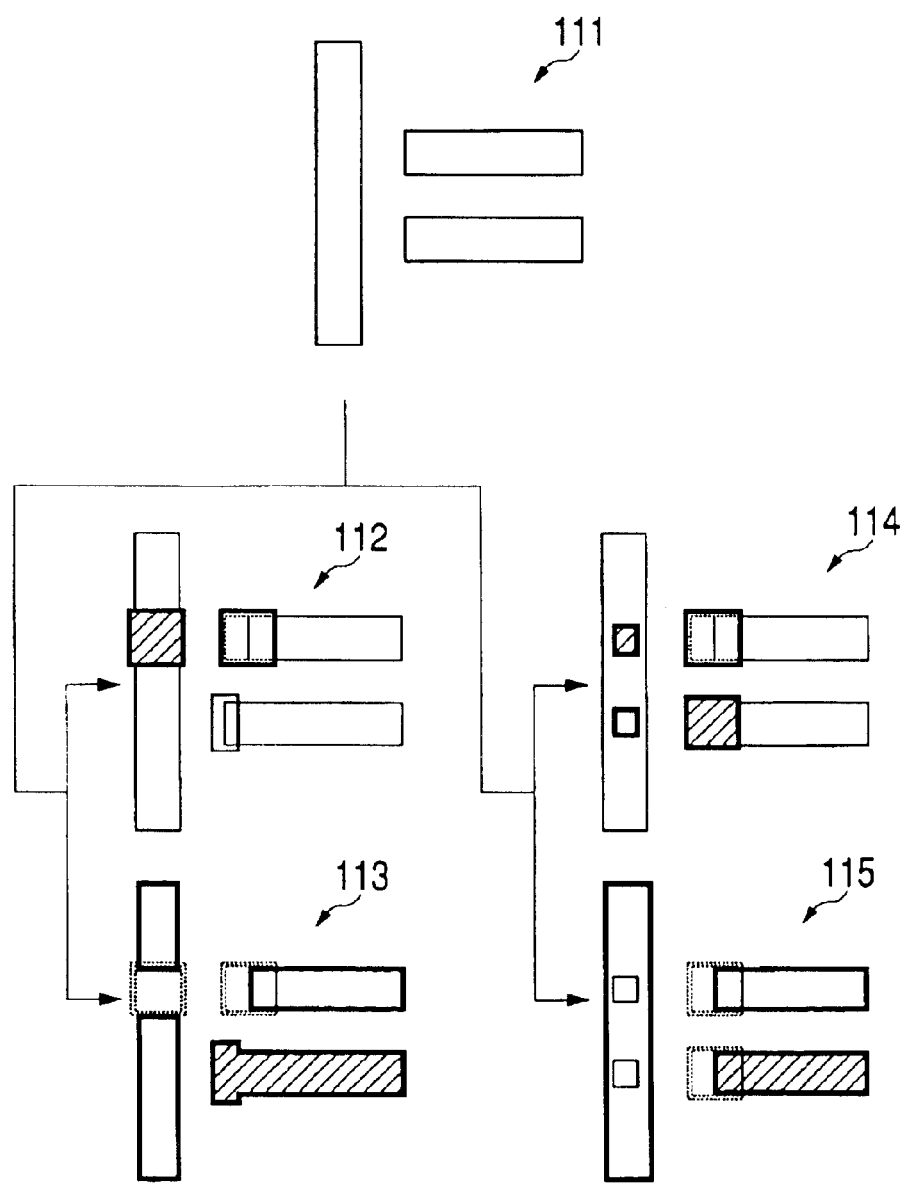
FIG. 21 is a schematic view showing an example of other pattern correcting means of the invention.

Meanwhile, conflict resolving patterns are generated for all the line ends which may cause conflicts and decomposed into masks, at two sheets of masks 114 and 115 shown at lower right of FIG. 21 by other arrow marks on the right side. Also in this case, in accordance with a phase relationship between patterns opposed on the second mask, there may be carried out a correction of changing pattern dimensions and pattern positions on the first mask.

(Embodiment 1)

An explanation will be given as follows of an example of forming a damascene wiring pattern layer pattern having a pitch of 0.3 µm by applying the above-explained method.

First, with regard to the designed wiring layer pattern having the pitch of 0.3 µm, in accordance with the method explained in reference to FIG. 26, mask data for two sheets of phase masks, that is, mask data for resolving phase conflicts and mask data for forming line pattern features are formed. In pattern data processings therefor there are used tools for geometrical operation for processing what is called mask data. Used programs are shown below.

Further, when dimensions, pitches and the like of wiring patterns are changed, it is preferable to pertinently change various dimension parameters in the programs, further, when function with regard to programs are substantially equivalent, the programs are not limited to the above-described.

In the following programs, SIZE(A;d), XSIZE(A;d), YSIZE(A;d) respectively designate operations moving respective sides of a pattern A from an inner side to an outer side of the pattern A in all directions, x direction, y direction by d and AND, +, − designate geometrical Bloolean operation. Notation input designates geometrical data of original designed pattern and notation Res_mask designates geometrical data of opening patterns of a mask for resolving phase conflicts and notation Line_mask designates geometrical data of opening patterns of a mask for forming line pattern features. Notation w designates a wiring width of a wiring pattern which is equal to a half of a period of a basic lattice. Notations dA, dB, dP respectively designate patterns for resolving phase conflicts of type A and type B and a dimension or shape correction parameter of a peripheral node pattern. Further, notation dLE designates a parameter for designating an amount of regress of a line end in contact with phase conflict of type A on a mask for forming line pattern features. Further, a portion surrounded by "" in the programs indicates a sentence of comment.

"Extract and Classify Line, Line-Crossing, Line-End"
input: "original mask data"
HS=XSIZE (input;-w)
HL=XSIZE (Hs;w): "horizontal lines"
VS=YSIZE (input;-w)
VL=YSIZE(VS;w): "vertical lines"
H_0=AND (HL, H_0 degree): "horizontal lines with 0 degree"
HL_p=AND (HL, H_p degree): "horizontal lines with p degree"
VL_0=AND (VL, V_0 degree): "vertical lines with 0 degree"
VL_p=AND (VL, V_p degree): "vertical lines with p degree)"
LN_0=HL_0+VL_0: "lines with 0 degree"
LN_p=HL_p+VL_p: "lines with p degree"
X_00=AND (HL_0, VL_0): "cross point of 0 degree H-line and 0 degree V-line"
X_pp=AND (HL_p, VL_p): "cross point of p degree H-line and p degree V-line"
X_0p=AND (HL_0, VL_P) "cross point of 0 degree H-line and p degree V-line"
X_p0=AND (HL_P, VL_0): "cross point of 0 degree H-line and p degree V-line"
X=X_00+X_pp+X_0p+X_p0: "cross point"
LE=(HL-HS)+(VL-VS)-X: "line end"
"Extract Type-A & Type-B Phase-Conflict"
typeA_0=XSIZE(XSIZE(LN_0;w/2);-w/2)+YSIZE (YSIZE(LN_0;w/2);-w/2)-LN_0
typeA_p=XSIZE(XSIZE(LN_p;w/2);-w/2)+YSIZE (YSIZE(LN_p,w/2);-w/2)-LN_p
typeA=typeA_0+typeA_p: "type A phase conflict"
Res_A=AND ((XSIZE(typeA; W)+YSIZE(typeA; w)), LE)
typeB=X_0p+X_p0: "type B phase conflict"
Res_B=tepeB
"Extract Peripheral Node":
Node=Res_A+Res_B
P_node1=AND(XSIZE(Node;2w)+YSIZE(Node;2w)-SIZE (Node;w), input): "possible peripheral node"
A=XSIZE (Node;w)+YSIZE (Node;w) B=SIZE (AND (A, input)-Node; w)
C=SIZE (A-B; w)
D=AND (B-C, PND1): "unnecessary peripheral node"
P_node=P_node1-D: "peripheral node"
"Patterns for Phase Conflict Resolution Mask":
Res_mask=SIZE(Res_A; dA)+AND(SIZE (Res_B;dB), input)+SIZE(P_node;dP)
"Patterns for Line Mask":
Line_mask=XSIZE(HL;-dLE)+YSIZE(VL;-dLE)+X_00+X_pp+(LE-Res_A)-Res_B By the above-described program, only portions of causing phase conflicts of type A and type B on designed data are extracted and patterns for resolving these are generated on the mask for resolving phase conflicts. Further, the above-described program shows only portions of generating opening pattern data on the respective masks. Further, actually with regard to the patterns generated above, there are carried out proximity effect correction and phase arrangement in accordance with positions on lattices (a specific program will be omitted here). Based on the mask data generated in this way, two sheets of phase-shifting masks are formed. There are used structures of the phase-shifting masks similar to those which have been known generally.

Next, an explanation will be given of steps of forming a wiring pattern using the above-described mask in reference to FIG. 22. First, an Si oxide film 12 is deposited on aa predetermined LSI substrate (Si) 11 to be formed with the damascene wirings thereabove. A predetermined anti-reflection coating 13 is formed thereabove and a positive tone photoresist film 14 for KrF excimer laser is coated to form (FIG. 22(a)).

Figure 22A:
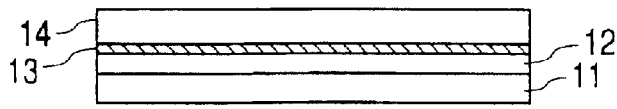
FIGS. 22(a) through 22(f) are sectional views of essential portions of respective steps showing steps of manufacturing a semiconductor integrated circuit device according to an embodiment of the invention.
Figure 22B:
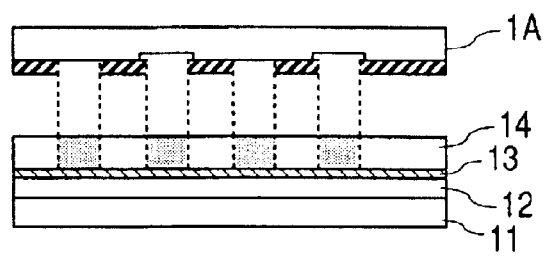

Next, the mask 1A for resolving phase conflicts is exposed after aligning an alignment mark attached to a side of a substrate (wafer) with an alignment mark attached to the mask 1A as explained in the next embodiment 2 (FIG. 22(b)). In exposure, there is used a reduction projection exposure apparatus (not illustrated) having a numeral aperture of 0.6 and constituting a light source by KrF excimer laser.

Figure 22C:
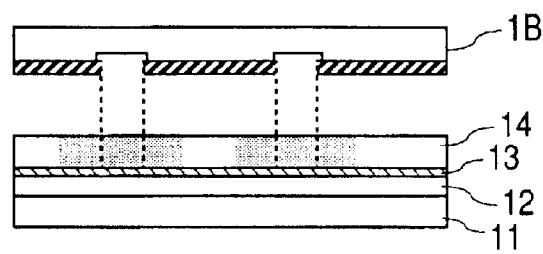
Figure 22D:
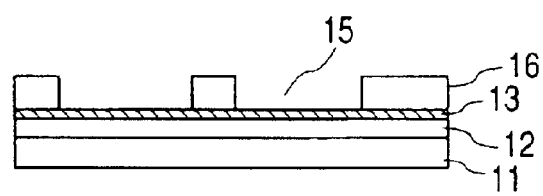
Figure 23:
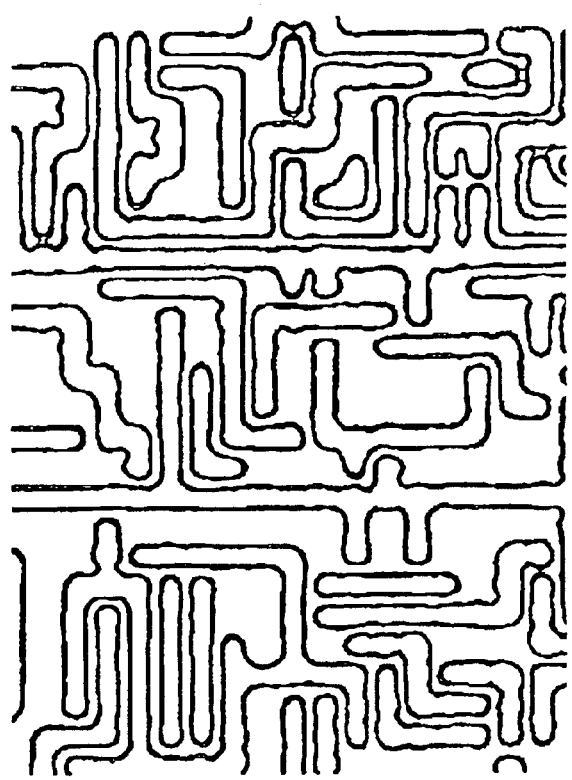
FIG. 23 is a characteristic view showing an example of an electrode wiring pattern characteristic according to an embodiment of the invention.

Successively, exposure is carried out by changing the mask 1A for resolving phase conflicts to the mask 1B for forming line pattern features and overlapping the same position on the same resist film 14 (FIG. 22(c)). At this occasion, in order to remove an error caused by a limit of reproducibility of detecting the alignment mark attached to the side of the substrate, two sheets of the masks are subjected to multiple exposure while fixing the wafer on a wafer stage. An explanation will be given of details thereof in Embodiment 2. FIG. 23 shows a two-dimensional (planar) distribution of a total sum of an amount of exposure of light irradiated into the photoresist film 14 by the multiple exposure. A photo-chemical reaction is caused in the resist in accordance with the amount of irradiating light, thereby, solubility of the resist is changed. It is known that the soluble reaction is caused in the resist substantially by a shape of the designed pattern. Next, after carrying out multiple exposure by two sheets of the masks, a predetermined heat treatment is carried out and the resist film is developed, as a result, the resist film is removed from a portion 15 to be formed with a desired wiring pattern (FIG. 22(d)).

Figure 22E:
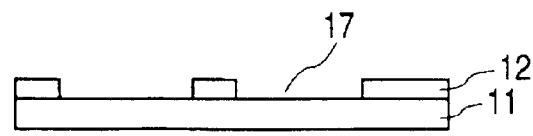

Next, by using a formed resist pattern 16 as a mask of etching, the anti-reflection coating 13 and the oxide film 12 are selectively etched to remove and thereafter, the resist 16 and the anti-reflection coating 13 are removed and a trench (opening portion) 17 of the oxide film is formed at a portion to be formed with the desired wiring pattern (FIG. 22(e)).

Figure 22F:
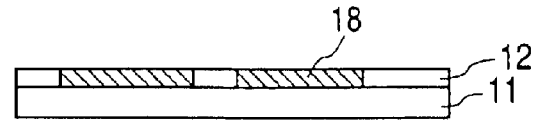

Thereafter, a barrier metal and a metal film of copper or the like are deposited in the trench (opening portion) of the oxide film and on the oxide film 12 as a wiring material, further, the metal film on the oxide film 12 is removed by subjecting a surface thereof to chemical mechanical polishing (CMP) to thereby leave the metal film only at inside of the trench (opening portion) to thereby form a desired wiring pattern 18 (FIG. 22(f)).

By the embodiment, a random wiring pattern having a very small pitch which has been difficult to resolve conventionally by the above-described exposure apparatus, can be formed with high accuracy and high yield. Further, mask pattern data used therefor can be designed in short period.

The wiring pattern, the kind of the exposure apparatus, wavelength of exposed light, the resist process, the wiring forming process and the like are not limited to those described in the embodiment. For example, an Al wiring pattern may be formed by using an i-line reduction projection exposure apparatus, forming a hard mask and an anti-reflection coating on an Al film, coating a negative tone resist thereon, subjecting two sheets of masks to multiple exposure and development and etching a matrix with the provided resist pattern as a mask. Further, an order of exposure of two sheets of the masks may be changed. After exposing the first mask by aligning the first mask to the alignment mark on the wafer, the second mask may be exposed by aligning the second mask again to the above-described alignment mark.

(Embodiment 2)

According to the embodiment, an explanation will be given of the exposure apparatus used in the above-described embodiment and an exposure sequence in reference to FIG. 24.

First, after fixing a substrate wafer 21 to a wafer adsorbing base on a wafer stage 22, an alignment mark 23 on the substrate is detected and a detection signal (wafer mark signal) thereof is stored to a pertinent storage medium. Meanwhile, a first mask 24 is fixed to a mask mounting stage (not illustrated) and an alignment mark 25 on the first mask 24 is detected. Next, by using the wafer mark signal 23 and the detection signal of the alignment mark 25 on the first mask 24, the first mask 25 and the substrate 21 are accurately aligned and thereafter, the first mask 24 is exposed to a resist mask (not illustrated) on the substrate 21 via a projection lens 26 (FIG. 24(a)). As the exposure apparatus, KrF excimer laser apparatus is used similar to the above-described.

Next, while fixing the substrate waver 21 at the wafer adsorbing base, the first mask 24 is changed to a second mask 27, thereafter, the second mask 27 and the substrate 21 are accurately aligned by using the wafer mark signal 23 and a detection signal of an alignment mark 28 on the second mask 27 and thereafter, the second mask 27 is exposed to the resist film on the substrate 21 (FIG. 24(b)).

Thereby, a factor of alignment error of patterns exposed by the respective masks, is constituted only by an error caused by a limit of reproducibility of detecting the alignment marks on the masks and positional accuracies of the patterns on the masks and 20 nm is achieved as alignment accuracy between the first mask and the second mask. By the embodiment, the random wiring pattern having the very small pitch can be formed by making high alignment accuracy and high throughput compatible to each other.

Although according to the embodiment, exposure is carried out by using the exposure apparatus of what is called stepper type for carrying out the exposure in a state in which the masks and the substrate are stationary, there may be used an exposure apparatus of what is called scan type for exposing the both while relatively scanning the both. Further, the effect of the invention is effective without depending on the light source of the exposure apparatus, a type of a projection optical system or the like.

Further, when a chip size on the mask is smaller than a half of an effective exposure region of the exposure apparatus, by arranging to align the pattern on the first mask (first pattern) and the pattern on the second mask (second pattern) on one sheet of the mask substrate, the alignment accuracy can further be promoted and the mask cost can significantly be saved.

According to an exposure method in this case, a second pattern region on the mask is blocked by using the masking blade function of the exposure apparatus, only the first pattern is exposed to a predetermined position (normally, plural positions) on the wafer substrate, successively, without removing the wafer from the wafer adsorbing base, the first pattern region is blocked by the masking blade and only the second pattern is exposed onto the wafer substrate. At this occasion, with regard to the above-described respective predetermined positions, exposure is carried out by moving the wafer stage from the position of exposing the first pattern by an amount of offset corresponding to a distance between an original point of the first pattern and an original point of the second pattern on the masks above the wafer substrate. However, in the multiple exposure, the original points of the two regions are to coincide with each other. In this case, the throughput is halved in comparison with the case of arranging a pattern for two chips on one sheet of a reticule.

Further, the throughput can also be prevented from being lowered by carrying out the operation as follows.

First, the first pattern region and the second pattern region are summarizingly exposed to a predetermined position on the substrate. Next, the first pattern region and the second pattern region are summarizingly exposed again after moving the wafer stage by the amount of offset corresponding to the distance between the original point of the first pattern region and the original point of the second pattern region on the masks above the wafer substrate.

Thereby, the first exposure region in exposure at a second time can overlappingly be transcribed to the second pattern region transcribed by exposure at a first time. By repeating the procedure, without using the masking blade function, the first pattern region and the second pattern region can be subjected to multiple exposure over an entire face of the wafer.

In this case, the first pattern and the second pattern are exposed under the same exposure condition and therefore, it is preferable to pertinently adjust pattern dimensions on the masks of the respective pattern regions such that patterns can be transcribed under the same exposure condition.

The above-described procedure is applicable not only to a reduction projection exposure apparatus of step and repeat system but also to a reduction projection exposure apparatus of what is called step and scan system similar to the above-described case.

(Embodiment 3)

In this embodiment, an explanation will be given of a method of manufacturing a semiconductor integrated circuit device using the method of Embodiment 1 in reference to FIG. 25.

FIG. 25 is a schematic view showing a manufacturing process of the above-described semiconductor apparatus by using a sectional view of a typical portion of the device.

Figure 25A:
FIGS. 25(a) through 25(d) are sectional views of essential portions of respective steps showing steps of manufacturing a semiconductor integrated circuit device according to an embodiment of the invention.
Figure 25B:
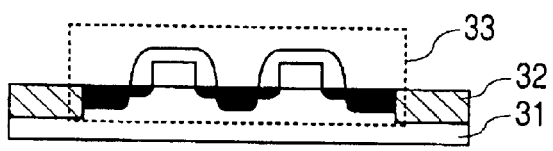
Figure 25C:
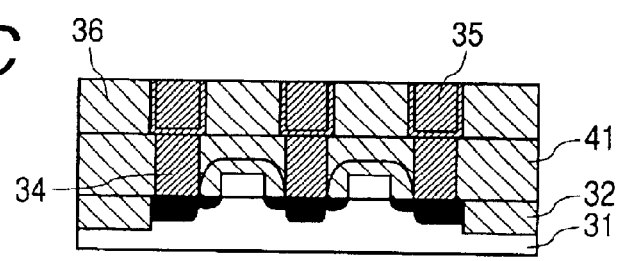
Figure 25D:
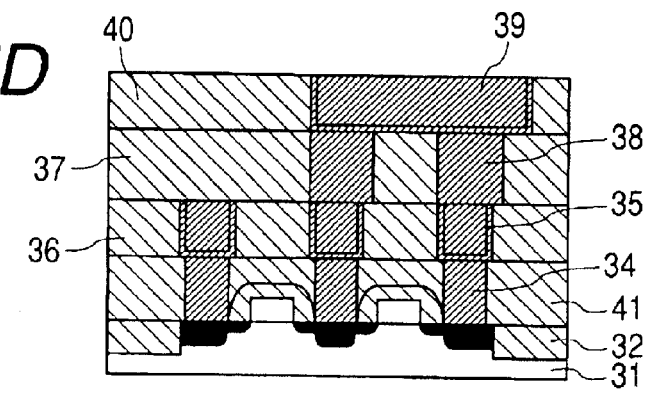

First, an isolation region 32 comprising an insulating substance of $SiO_2$ or the like is formed in an Si substrate 31 (FIG. 25(a)), thereafter, a plurality of semiconductor regions for constituting a plurality of MOS transistors 33 are formed (FIG. 25(b)) and contact holes 34 are formed (FIG. 25(c)). Numeral 41 designates an insulating film of $SiO_2$ or the like. Thereafter, first layer wirings 35 and an inter-wiring insulating film 36 are formed (FIG. 25(c)), an inter-layer insulating film 37 and conductive vias or contacts 38 embedded therein are formed thereabove and a second layer wiring 39 and an inter-wiring insulating film 40 are formed (FIG. 25(d)).

Wirings of a third and further wirings (not illustrated) are similarly formed. According to the embodiment, in forming patterns of the first layer wiring and the second layer wiring, a method similar to that shown in Embodiment 1 is used.

By the embodiment, a semiconductor integrated circuit having very small pitch wirings which have been difficult to manufacture by the conventional projection exposure method, can be manufactured with high accuracy, high yield and high throughput.

(Embodiment 4)

According to the program of Embodiment 1, only portions of causing the phase conflicts of type A and type B are extracted in view of design data and patterns for resolving the phase conflicts are generated on the phase conflict resolving mask. Therefore, a number of patterns for resolving the phase conflicts are generated on the phase conflict resolving mask. Therefore, a number of patterns for the phase conflict resolving mask is restrained and burden with regard to writing the mask can be reduced. However, on the other hand, the geometrical operation is rather complicated and therefore, in the case of the large scale semiconductor circuits, there poses a problem that time is required in generating pattern data in the respective mask.

Hence, according to the embodiment, all of wiring ends which may cause the phase conflict of type A are extracted, patterns on the phase conflict resolving mask are generated therefor, further, also with regard to type B, all of intersections and corners of vertical and horizontal patterns which can cause the phase conflict of type B are extracted and patterns on the phase conflict resolving mask are generated therefor. Individual phase arrangement in the mask for resolving the phase conflicts of the both types and the mask for straight line portions, is carried out after generating all the pattern data for two sheets of the masks. Also according to the embodiment, by applying the embodiment to the lock LSI, the mask data can be generated in a comparatively short period of time.

(Embodiment 5)

Next, an explanation will be given of an example of applying the invention to an NAND cell as an actual logic gate circuit portion.

Figure 28A:
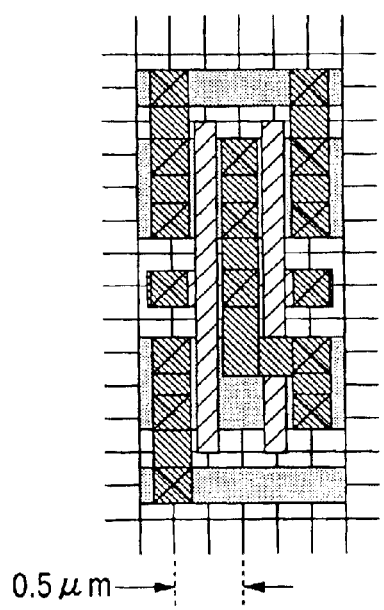
FIGS. 28(a) and 28(b) are plane views of essential portions for explaining an effect at a logic gate circuit portion formed by the invention.
Figure 28B:
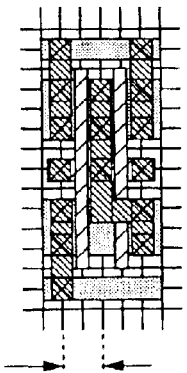
Figure 29:
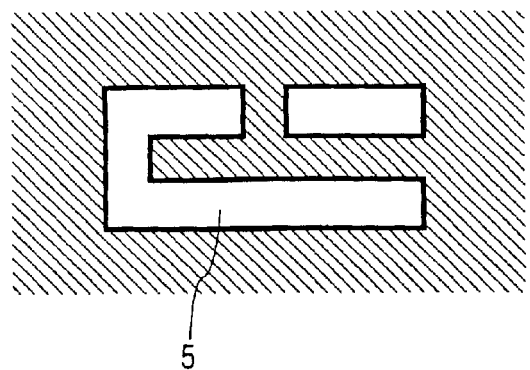
FIG. 29 is a plane view of a schematic pattern for explaining a problem of a conventional method.
Figure 30A:
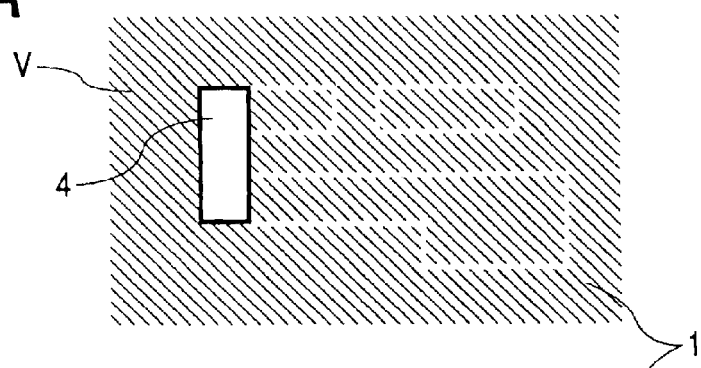
FIGS. 30(a) and 30(b) are plane views of a schematic pattern showing the problem of the conventional method.
Figure 30B:
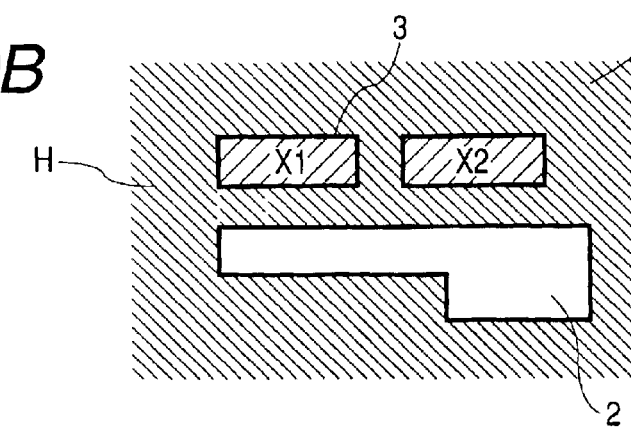

FIG. 28 shows a planar pattern of the NAND cell per se and FIG. 28(*a*) shows a constitution manufactured by using the conventional projection exposure technology without applying the invention and isolation regions, source regions, drain regions, gate electrodes and the like are formed at a pitch of 0.5 μm, that is, at intervals of 0.25 μm.

In contrast thereto, as a result of tentatively manufacturing an NAND gate circuit cell having a pattern constitution quite the same as that of FIG. 28(*a*) by using an exposure apparatus the same as that explained in reference to FIG. 24, as shown by FIG. 28(*b*), isolation regions, source regions, drain regions, gate electrodes and the like can be formed at a pitch of 0.3 μm, that is, at intervals of 0.15 μm and it can be confirmed that an area reducing effect for a semiconductor chip is significant.

Further, it can also be confirmed that by changing the exposure apparatus or the resist process used, the size of the mask pattern can further be reduced. Thereby, there can be achieved a prospect of capable of manufacturing LSI by freely using the projection exposure technology even in the case of a very small pattern having an interval smaller than a pitch of 0.3 μm, that is, smaller than 0.15 μm. For example, it is confirmed that a main pattern design dimension can be reduced by about 10% by changing the numeral aperture of the KrF excimer laser exposure apparatus from 0.6 to 0.68 and a pattern dimension can be reduced by about 20% by using the ArF excimer laser exposure apparatus.

As described above, as is understood from the various explanation, the invention is applicable to forming the isolation region 32, or the gate electrode pattern and the source and the drain electrode patterns of the MOS transistor 33, and/or forming electrode wirings 34 and the like at an inner portion of a very small circuit unit constituted thereby, by substantially similar procedures. Further, the invention is applicable not only to forming the electrodes and the wiring patterns but also applicable to forming very small patterns for selectively forming a number of semiconductor regions constituting a number of circuit elements at inside of a semiconductor substrate of Si or the like.

INDUSTRIAL APPLICABILITY

As described above, according to the invention, in forming random (irregular) and an enormous amount of very small circuit patterns, by subjecting at most two sheets of phase-shifting masks of a phase mask arranged with phases such that phases between opening patterns proximate to each other corresponding to a circuit pattern are reversed and having a phase conflict resolving pattern generated for the phase conflict of type A in which same phase patterns are proximate to each other and the phase conflict of type B in which reverse phase patterns are brought into contact with each other, and a complimentary phase mask for forming a design pattern complimentarily therewith, to multiple exposure on the same substrate, even when a dimension of the circuit pattern exceeds a resolution limit of the conventional light exposure method, the circuit pattern can be formed. Thereby, a semiconductor circuit (particularly, logic LSI having a random wiring pattern) having a very small wiring pattern which has been considered to be difficult to manufacture realistically by the conventional optical lithography, can be manufactured by using the optical lithography and high performance formation and high function formation of a semiconductor apparatus can be achieved at low cost. Further, even a random (irregular) and an enormous amount of very small circuit patterns of a wiring pattern of a logic LSI or the like having a very small circuit dimension exceeding a resolution limit of the conventional light exposure method, can be designed and manufactured at low cost and in a short period of time.

What is claimed is:

1. A method of manufacturing a semiconductor integrated circuit device characterized in that in forming a pattern on a photosensitive substrate by subjecting the substrate to projection exposure by using a mask having a circuit pattern, the photosensitive substrate is subjected to multiple projection exposures by using:

a first phase-shifting mask including:

a first phase conflict resolving mask pattern for forming a mask light transmitting portion corresponding to a pattern region for constituting a first possible phase conflict region at a vicinity of a distal end portion of a linear aperture having an adjacent pattern of the same phase arranged in a light shielding area within a predetermined distance therefrom, and a second phase conflict resolving mask pattern for forming a mask light transmitting portion corresponding to a pattern region for constituting a second possible phase conflict region at a vicinity of an intersection of a linear aperture extending in a vertical direction and a linear aperture extending in a horizontal direction having different phases, respectively; and a second phase-shifting mask including a linear aperture complementary pattern for forming the predetermined circuit pattern by subjecting the photosensitive substrate to multiple exposures along with the first and the second phase conflict resolving mask patterns.

2. The method of manufacturing a semiconductor integrated circuit device according to claim 1, characterized in that the circuit pattern is present on a predetermined lattice and the first and the second phase conflict resolving mask patterns are present on lattice points of the lattice.

3. A method of manufacturing a mask characterized in that, in manufacturing a mask for forming a circuit pattern on a substrate by projecting a mask constituting a light transmitting pattern by the circuit pattern to a resist film formed on the substrate by way of a projection optical system:

a pattern at a vicinity of a distal end portion of a linear aperture pattern having an adjacent pattern of the same phase arranged in a light shielding area within a predetermined distance therefrom is extracted and stored as first possible phase conflict region information, a pattern at a vicinity of an intersection of a linear aperture pattern extended in a vertical direction and a linear aperture pattern extended in a horizontal direction having different phases, respectively, is extracted and stored as second possible phase conflict region information, phase conflict resolving patterns for resolving phase conflicts are generated corresponding to respective regions by using the first and the second phase conflict region information, linear aperture complementary patterns for forming the desired circuit pattern by subjecting a same photosensitive substrate to multiple exposures along with the phase conflict resolving patterns are generated, and a first phase-shifting mask including the phase conflict resolving patterns and a second phase-shifting mask including the linear aperture complementary patterns are manufactured.

4. The method of manufacturing a mask according to claim 3, characterized in that the phase conflict resolving pattern for the first possible phase conflict region is a phase-shifting pattern arranging phases reverse to each other to a pair of regions interposing a space region at distal end portions of line patterns.

5. The method of manufacturing a mask according to claim 4, characterized in that the phase conflict resolving pattern for the second possible phase conflict region includes a light transmitting portion arranged at an intersection of the line patterns.

6. The method of manufacturing a mask according to claim 5, characterized in that the circuit pattern is present on a predetermined lattice and the phase conflict resolving-patterns are present on lattice points of the lattice.

7. The method of manufacturing a mask according to claim 4, characterized in that the circuit pattern is present on a predetermined lattice and the phase conflict resolving patterns are present on lattice points of the lattice.

8. The method of manufacturing a mask according to claim 3, characterized in that the circuit pattern is present on a predetermined lattice and the first and the second phase conflict resolving patterns are present on lattice points of the lattice.

* * * * *